US011232781B2

(12) United States Patent
Iwase et al.

(10) Patent No.: US 11,232,781 B2
(45) Date of Patent: Jan. 25, 2022

(54) INFORMATION PROCESSING DEVICE, INFORMATION PROCESSING METHOD, VOICE OUTPUT DEVICE, AND VOICE OUTPUT METHOD

(71) Applicant: SONY CORPORATION, Tokyo (JP)

(72) Inventors: Hiro Iwase, Kanagawa (JP); Mari Saito, Kanagawa (JP); Shinichi Kawano, Tokyo (JP)

(73) Assignee: SONY CORPORATION, Tokyo (JP)

( * ) Notice: Subject to any disclaimer, the term of this patent is extended or adjusted under 35 U.S.C. 154(b) by 90 days.

(21) Appl. No.: 16/492,249

(22) PCT Filed: Apr. 3, 2018

(86) PCT No.: PCT/JP2018/014200
§ 371 (c)(1),
(2) Date: Sep. 9, 2019

(87) PCT Pub. No.: WO2018/193826
PCT Pub. Date: Oct. 25, 2018

(65) Prior Publication Data
US 2020/0051546 A1 Feb. 13, 2020

(30) Foreign Application Priority Data

Apr. 17, 2017 (JP) .............................. JP2017-081035

(51) Int. Cl.
G10L 13/047 (2013.01)
G10L 25/51 (2013.01)
(52) U.S. Cl.
CPC ............ G10L 13/047 (2013.01); G10L 25/51 (2013.01)

(58) Field of Classification Search
CPC .............................. G10L 13/047; G10L 25/51
See application file for complete search history.

(56) References Cited

U.S. PATENT DOCUMENTS 10,147,439 B1\* 12/2018 Kristjansson ............. G01S 5/18
2012/0008802 A1\* 1/2012 Felber ..................... G10L 15/22
381/107
2016/0301373 A1 10/2016 Herman et al.

FOREIGN PATENT DOCUMENTS

EP 3089128 A2 11/2016
EP 3270361 A1 1/2018
(Continued)

OTHER PUBLICATIONS

International Search Report and Written Opinion of PCT Application No. PCT/JP2018/014200, dated Jun. 19, 2018, 10 pages of ISRWO.
(Continued)

Primary Examiner — Sonia L Gay
(74) Attorney, Agent, or Firm — Chip Law Group

(57) ABSTRACT

The present technology relates to an information processing device, an information processing method, a voice output device, and a voice output method that allow a user to hear a speech from a home agent unit regardless of where the user is. The voice output device outputs, on the basis of an image and noise from a predetermined noise source which are obtained in a unit capable of outputting a voice toward a user, information indicating hearing difficulty of a voice from the unit at a position of the user. The present technology can be applied to a household voice assistant device that performs a speech to a user.

20 Claims, 16 Drawing Sheets

(56) References Cited

FOREIGN PATENT DOCUMENTS

| | | |
|---|---|---|
| JP | 2001-154679 A | 6/2001 |
| JP | 2010-200280 A | 9/2010 |
| JP | 2012-255852 A | 12/2012 |
| WO | 2012/169095 A1 | 12/2012 |

OTHER PUBLICATIONS

Office Action for JP Patent Application No. 2019-513538 dated Aug. 24, 2021, 03 pages of Office Action and 03 pages of English Translation.

* cited by examiner

FIG. 16

```
{
  "agent": {
    "hearingScore": 4.05,          ← 311
    "factor": {
      "userDistance": 5,            ← 312
      "noiseSources": [
        {"level":0.8,  "angle":20},  ← 313
        {"level":0.5,  "angle":130}  ← 314
      ]
    }
  },
  "externals": [
    {
      "hearingScore": 1.35,         ← 321
      "factor": {
        "userDistance": 3,          ← 322
        "noiseSources": [
          {"level":0.8,  "angle":30},  ← 323
          {"level":0.5,  "angle":110}  ← 324
        ]
      }
    },
    {
      "hearingScore": 6.28,         ← 331
      "factor": {
        "userDistance": 8,          ← 332
        "noiseSources": [
          {"level":0.8,  "angle":70},  ← 333
          {"level":0.5,  "angle":10}   ← 334
        ]
      }
    }
  ]
}
```

INFORMATION PROCESSING DEVICE, INFORMATION PROCESSING METHOD, VOICE OUTPUT DEVICE, AND VOICE OUTPUT METHOD

CROSS REFERENCE TO RELATED APPLICATIONS

This application is a U.S. National Phase of International Patent Application No. PCT/JP2018/014200 filed on Apr. 3, 2018, which claims priority benefit of Japanese Patent Application No. JP 2017-081035 filed in the Japan Patent Office on Apr. 17, 2017. Each of the above-referenced applications is hereby incorporated herein by reference in its entirety.

TECHNICAL FIELD

The present technology relates to an information processing device, an information processing method, a voice output device, and a voice output method, and particularly relates to an information processing device, an information processing method, a voice output device, and a voice output method that allow a user to hear a speech from a home agent unit.

BACKGROUND ART

Conventionally, there are devices that control the volume of a voice to be output according to a surrounding environment. For example, Patent Document 1 discloses an electronic device that determines the volume of a speaker on the basis of an ambient volume obtained from a microphone.

Furthermore, in recent years, home-use voice assistant devices (home agent units) that perform a speech to a user have been provided.

CITATION LIST

Patent Document

Patent Document 1: Japanese Patent Application Laid-Open No. 2009-226169

SUMMARY OF THE INVENTION

Problems to be Solved by the Invention

However, in a home, various environmental sounds of living of people are present. Depending on a generation status of these environmental sounds and a location of a user, the user may not hear or may miss a speech from the home agent unit.

The present technology has been made in view of such a situation, and enables the user to hear a speech from the home agent unit regardless of where the user is.

Solutions to Problems

An information processing device of a first aspect of the present technology includes a processing part that outputs, on the basis of an image and noise from a predetermined noise source which are obtained in a unit capable of outputting a voice toward a user, information indicating hearing difficulty of a voice from the unit at a position of the user.

An information processing method of the first aspect of the present technology includes a step of outputting, on the basis of an image and noise from a predetermined noise source which are obtained in a unit capable of outputting a voice toward a user, information indicating hearing difficulty of a voice from the unit at a position of the user.

In the first aspect of the present technology, on the basis of an image and noise from a predetermined noise source which are obtained in a unit capable of outputting a voice toward a user, information indicating hearing difficulty of a voice from the unit at a position of the user is output.

A voice output device according to a second aspect of the present technology includes a voice output control part that generates, by using information that is generated on the basis of an image and noise from a predetermined noise source which are obtained in an own device and indicates hearing difficulty of a voice from the own device at a position of a user, a parameter that determines a characteristic of the voice to be output toward the user, to control outputting of the voice.

A voice output method according to the second aspect of the present technology includes a step of generating, by using information that is generated on the basis of an image and noise from a predetermined noise source which are obtained in an own device and indicates hearing difficulty of a voice from the own device at a position of a user, a parameter that determines a characteristic of the voice to be output toward the user, to control outputting of the voice.

In the second aspect of the present technology, by using information that is generated on the basis of an image and noise from a predetermined noise source which are obtained in an own device and indicates hearing difficulty of a voice from the own device at a position of a user, a parameter that determines a characteristic of the voice to be output toward the user is generated, to control outputting of the voice.

Effects of the Invention

According to the present technology, it is possible to hear a speech from a home agent unit regardless of where a user is. Note that the effect described here is not necessarily limited, and may be any effect described in the present disclosure.

BRIEF DESCRIPTION OF DRAWINGS

FIG. 16 is a diagram illustrating an example of a result of Web API processing.

MODE FOR CARRYING OUT THE INVENTION

Hereinafter, modes for carrying out the present disclosure (hereinafter referred to as embodiments) will be described. Note that the description will be made in the following order.

1. Environmental sound at home
2. First embodiment (home agent unit alone)
3. Second embodiment (cooperation between home agent unit and external unit)
4. Third embodiment (application to cloud computing)
5. Others (application to units used outdoors)

1. Environmental Sound at Home

Figure 1:
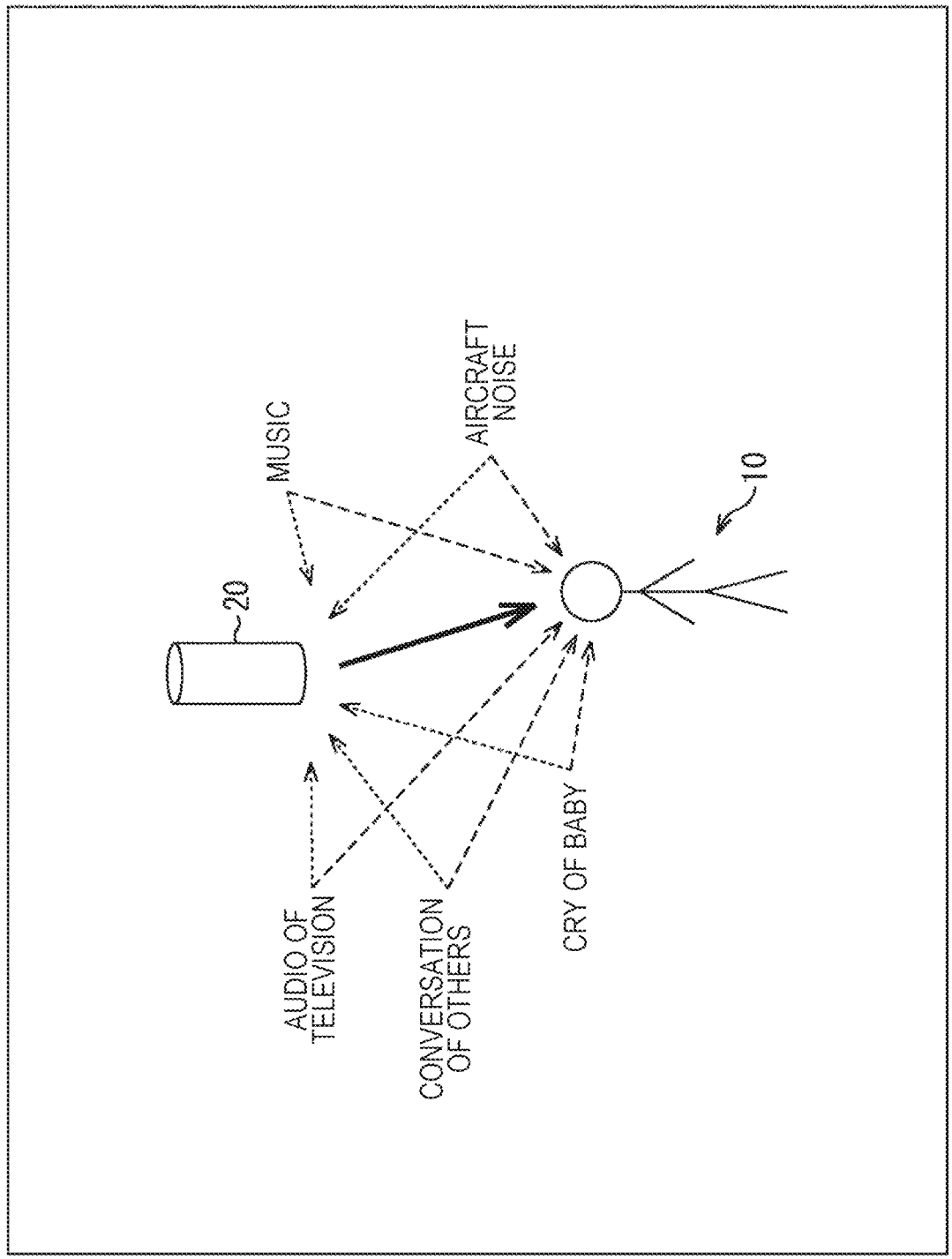
FIG. 1 is a diagram explaining an environmental sound in a home.

In FIG. 1, a user 10 and a voice output device 20 that performs a speech to the user 10 are illustrated. The voice output device 20 is configured as a voice assistant device for home (home agent unit).

As illustrated in FIG. 1, in a home, various environmental sounds (such as audio of television, conversation of others, cry of baby, music, aircraft noise, and so on) in living of people are present. Depending on generation statuses of these environmental sounds and the location of a user, the user 10 may not hear or may miss a speech from the voice output device 20.

In a conventional home agent unit, a volume to be output is manually adjusted by the user directly touching the unit, such as turning or touching a dial, or by a voice command by a speech of the user. When the user is in a place where the home agent unit cannot be touched, or when the speech of the user is not recognized by the home agent unit due to noise, such manual volume adjustment becomes difficult.

On the other hand, when the volume is raised by manual volume adjustment, there is a possibility that the speech of the home agent unit itself becomes noise in the home. In particular, when the position of the user or environmental sound conditions change, sound louder than necessary may be output.

Furthermore, depending on the relationship between a noise amount and the position of the user, even if the output volume of the home agent unit is maximized, the user may not be able to hear the speech due to a performance limit of the output device.

Moreover, when the user is concentrating on work such as housework, the user may not be aware of the speech from the home agent unit and may not notice the speech itself.

Accordingly, in the following, an embodiment will be described in which the speech from the home agent unit can be heard regardless of where the user is.

2. First Embodiment (Functional Configuration Example of Voice Output Device)

Figure 2:
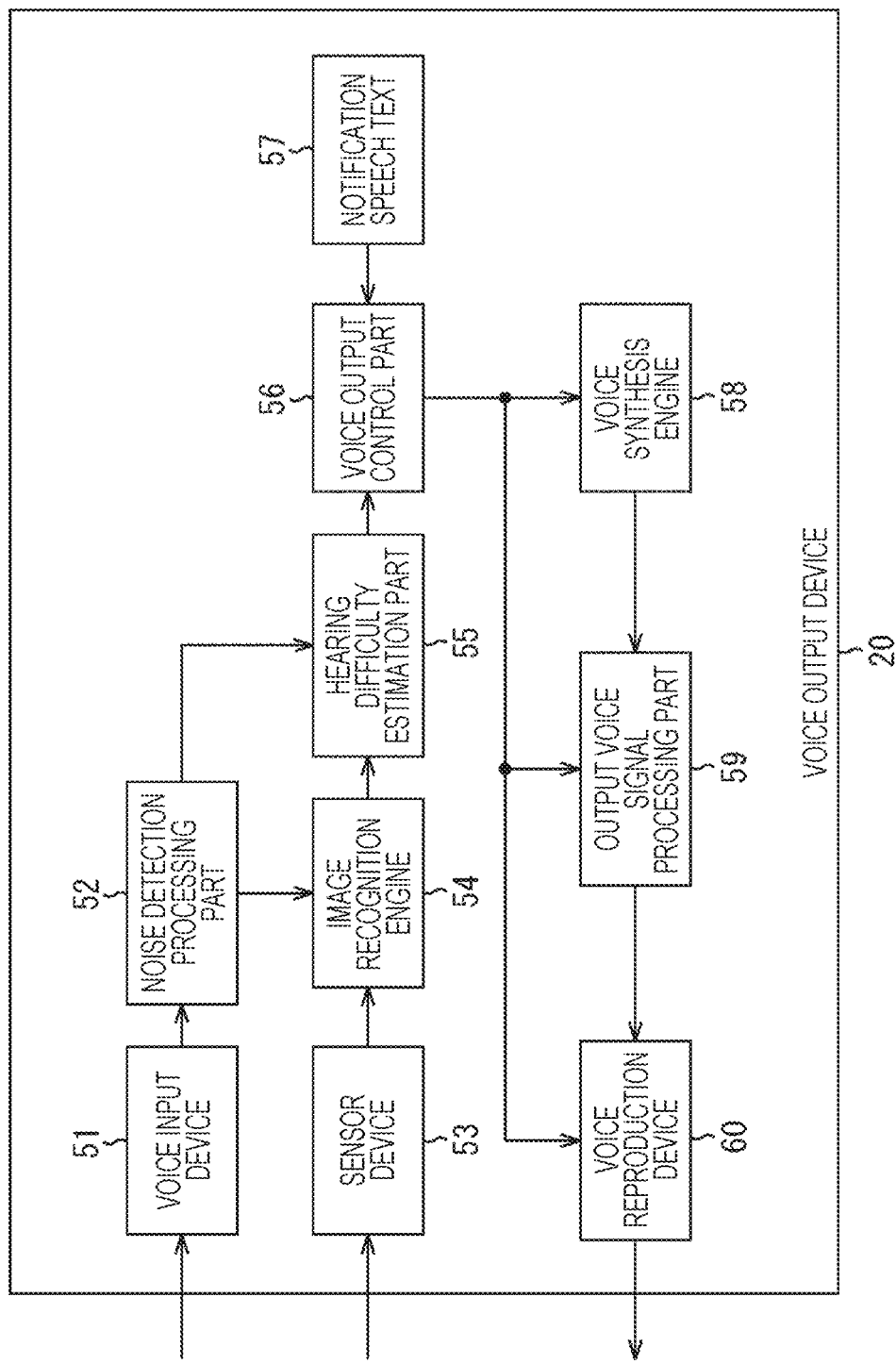
FIG. 2 is a block diagram illustrating an example of a functional configuration of a voice output device to which the present technology is applied.

FIG. 2 illustrates a functional configuration example of a voice output device 20 according to a first embodiment to which the present technology is applied.

The voice output device 20 recognizes positions of a user 10 and a noise source 30, and estimates hearing difficulty of a voice at the position of the user 10 on the basis of the positional relationship among the user 10, the voice output device 20, and the noise source 30. Then, the voice output device 20 outputs a voice whose characteristics are adjusted so as to adapt to the estimated hearing difficulty.

Note that the voice output device 20 is configured as the above-described home agent unit, but can be configured as a general unit that includes a microphone and a camera and outputs a voice to the user 10.

The voice output device 20 includes a voice input device 51, a noise detection processing part 52, a sensor device 53, an image recognition engine 54, a hearing difficulty estimation part 55, a voice output control part 56, a notification speech text 57, a voice synthesis engine 58, an output voice signal processing part 59, and a voice reproduction device 60.

The voice input device 51 includes a plurality of microphones (microphone arrays). A sound emitted from the noise source 30 is input to the voice input device 51. The voice input device 51 supplies input voice data corresponding to the input sound to the noise detection processing part 52.

The noise detection processing part 52 detects the direction of the noise source 30 and the volume of noise from this direction on the basis of input voice data from the voice input device 51. The noise detection processing part 52 supplies information indicating the detected direction of the noise source 30 and the volume of noise to the hearing difficulty estimation part 55. Furthermore, the noise detection processing part 52 supplies information indicating the detected direction of the noise source 30 to the image recognition engine 54.

The sensor device 53 includes a stereo camera and a depth sensor. An image captured by the sensor device 53 and depth information (distance information) of a subject in the image are supplied to the image recognition engine 54.

The image recognition engine 54 detects the direction of the user 10 as a speech target and the distance to the user 10 on the basis of the image and the depth information from the sensor device 53. Furthermore, on the basis of the image and the depth information from the sensor device 53 and the information indicating the direction of the noise source 30 from the noise detection processing part 52, the image recognition engine 54 detects the distance to an object (noise source 30) present in the direction. Information indicating the direction of the user 10, the distance to the user 10, and the distance to the noise source 30 is supplied to the hearing difficulty estimation part 55.

The hearing difficulty estimation part 55 estimates hearing difficulty of a voice from the voice output device 20 at the position of the user on the basis of information from the noise detection processing part 52 and information from the image recognition engine 54. The hearing difficulty estimation part 55 supplies information indicating the hearing difficulty to the voice output control part 56.

The voice output control part 56 generates voice parameters for determining characteristics of a voice to be output toward the user 10 using the information indicating the hearing difficulty from the hearing difficulty estimation part 55, and supplies the voice parameters to the voice synthesis engine 58, the output voice signal processing part 59, and the voice reproduction device 60. Note that a part of the voice parameters is supplied to the voice synthesis engine 58 together with a notification speech text 57 indicating speech contents.

The voice synthesis engine 58 generates a voice signal by performing voice synthesis using the voice parameters from the voice output control part 56 and the notification speech text 57. The voice synthesis engine 58 supplies the generated voice signal to the output voice signal processing part 59.

The output voice signal processing part 59 performs signal processing on the voice signal from the voice synthesis engine 58 using the voice parameters from the voice output control part 56, and supplies the processed signal to the voice reproduction device 60.

The voice reproduction device 60 includes a speaker. The voice reproduction device 60 outputs a voice according to the voice signal from the output voice signal processing part 59 with a sound volume based on the voice parameters from the voice output control part 56.

(Flow of Voice Output Processing)

Next, the flow of voice output processing by the voice output device 20 will be described with reference to a flowchart of FIG. 3.

In step S11, the noise detection processing part 52 detects the direction of a noise source 30 on the basis of input voice data from the voice input device 51, and performs sound source separation to obtain only voice components in the detected direction, so as to detect a volume of noise from this direction.

As a method of detecting the direction of a sound source using a plurality of microphones such as the voice input device 51, for example, a method using a cross correlation function is generally used. Although a detailed description is omitted, it is possible to detect an arrival time difference (delay) of two microphones that takes the maximum value of this cross correlation function, and to estimate an arrival direction of a sound wave on the basis of this time difference.

Furthermore, the technique of beam forming can be applied to the sound source separation to obtain only the voice components in the detected direction.

Then, the noise amount is calculated from the level of the obtained voice components. For calculation of the noise amount, the root mean square (RMS) of an amplitude value of the voice signal in a predetermined unit time (for example, one frame time of an image captured by the camera constituting the sensor device 53) is used.

Note that the number of noise sources is not limited to one, and there may be a plurality of noise sources. In this case, when detecting directions of sound sources, not only the maximum value of the cross correlation function but also a time difference that takes a plurality of peaks exceeding a predetermined threshold are used. Furthermore, the level of voice components in each direction subdivided by the sound source separation may be calculated, and the noise amount may be calculated using a plurality of peaks exceeding the threshold.

In step S12, the image recognition engine 54 detects the direction of a user 10 as a speech target and the distance to the user 10 using face recognition on the basis of an image and depth information supplied from the sensor device 53.

Specifically, the image recognition engine 54 detects the face of the user 10 from the image from the sensor device 53 on the basis of the face of the user 10 registered in advance. Furthermore, the image recognition engine 54 calculates the direction (angle) of the user 10 from the position of the detected face in the image, and calculates the distance to the user 10 from the depth information at the position of the detected face in the image.

Note that the distance to the user 10 may be calculated on the basis of the size of the detected face.

Subsequently, in step S13, the image recognition engine 54 detects the distance to the noise source 30 on the basis of information indicating the direction of the noise source 30 from the noise detection processing part 52.

Specifically, the image recognition engine 54 learns in advance an object (a person, a television, an audio unit, a speaker, an air conditioner, a window, and so on) which can be a noise source. Then, when the image recognition engine 54 recognizes the above-described object in the direction indicated by the information from the noise detection processing part 52 in the image from the sensor device 53, the image recognition engine 54 calculates the distance to the noise source 30 from depth information at the position of the object in the image.

Note that in the noise detection processing part 52, as the direction of the noise source 30, an angle in a vertical direction may be detected in addition to the angle in a horizontal direction. In this case, the image recognition engine 54 calculates the distance to the noise source 30 from depth information at coordinates in the image determined by the angle in the horizontal direction and the angle in the vertical direction of the noise source 30.

Furthermore, in a case where the object cannot be recognized in the direction of the noise source and the angle in the vertical direction is not detected, the distance to the noise source 30 may be calculated using a representative value (maximum value, minimum value, average value, or the like) of depth information at coordinates in the image determined by the angle in the horizontal direction of the noise source.

In step S14, the hearing difficulty estimation part 55 calculates a hearing difficulty score indicating hearing difficulty at the position of the user 10 on the basis of the positional relationship between the user 10 and the noise source 30.

Figure 4:
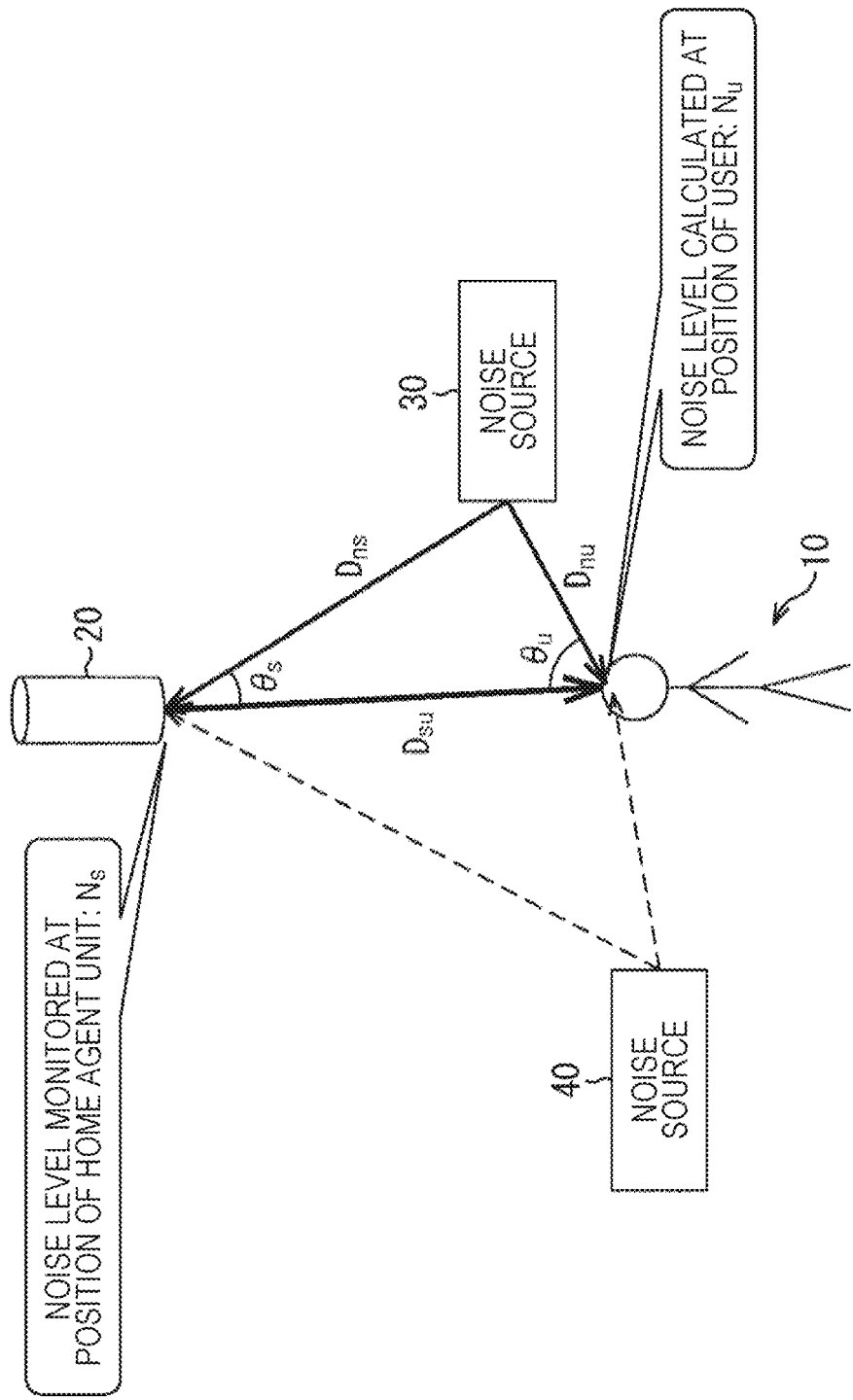
FIG. 4 is a diagram illustrating a positional relationship among a user, a voice output device, and a noise source.

Here, as illustrated in FIG. 4, the sound volume (noise level) of a noise at the position of the home agent unit (voice output device 20) detected by the noise detection processing part 52 is $N_s$, the distance to the user 10 detected by the image recognition engine 54 is $D_{su}$, and the distance to the noise source 30 is $D_{ns}$.

Furthermore, an angular difference between the user 10 and the noise source 30 as viewed from the voice output device 20 is denoted by $\theta_s$, the angular difference being calculated from the direction of the noise source 30 detected by the noise detection processing part 52 and the direction of the user 10 detected by the image recognition engine 54.

First, the hearing difficulty estimation part 55 calculates a distance $D_{nu}$ between the noise source 30 and the user 10 by using the following equation according to the cosine theorem.

$$D_{nu} = \sqrt{D_{ns}^2 + D_{su}^2 - 2 \times D_{ns} \times D_{su} \times \cos\theta_s} \quad \text{[Equation 1]}$$

Next, the hearing difficulty estimation part 55 calculates an angular difference $\theta_u$ between the voice output device 20 and the noise source 30 as viewed from the user 10 using the following equation according to the cosine theorem.

$$\theta_u = \cos^{-1}\left(\frac{D_{su}^2 + D_{nu}^2 - D_{ns}^2}{2 \times D_{su} \times D_{nu}}\right) \quad \text{[Equation 2]}$$

Then, the hearing difficulty estimation part 55 calculates a noise level $N_u$ at the position of the user 10 using the following equation on the basis of sound pressure attenuation characteristics of a point sound source according to the distance.

$$N_u = N_s \times \left(\frac{D_{ns}}{D_{nu}}\right). \qquad \text{[Equation 3]}$$

Each of the noise level $N_u$ at the position of the user 10, the angular difference $\theta_u$ between the voice output device 20 and the noise source 30 as viewed from the user 10, and the distance $D_{su}$ between the voice output device 20 and the user 10 calculated as described above can be individually assumed as a hearing difficulty score indicating the hearing difficulty of a voice from the voice output device 20 at the position of the user 10.

The larger the value of the noise level $N_u$ at the position of the user 10, the more the hearing difficulty increases by masking of the voice from the agent unit by the noise.

The angular difference $\theta_u$ between the voice output device 20 and the noise source 30 as viewed from the user 10 takes a value of 0° to 180°, and the larger this value, the easier it is to hear by cocktail party effect by sound image separation. In other words, the smaller the value of the angular difference $\theta_u$, the more difficult it is to hear.

The larger the distance $D_{su}$ between the voice output device 20 and the user 10, the more the hearing difficulty increases due to attenuation of sound by the distance.

Here, it is further assumed that the hearing difficulty estimation part 55 calculates a hearing difficulty score $S_u$ indicating the hearing difficulty at the position of the user 10 using these three parameters.

Note that, as illustrated in FIG. 4, in a case where a noise source 40 is present in addition to the noise source 30, the noise detection processing part 52 detects respective directions of the noise sources 30 and 40 and volumes of noises from respective directions. In this case, the noise level $N_u$ at the position of the user 10 and the angular difference $\theta_u$ between the voice output device 20 and the noise source as seen from the user 10 are calculated for every noise source.

Therefore, in a case where there are n noise sources, the noise level $N_u$ and the angular difference $\theta_u$ are calculated for every noise source, so that $\{N_{u1}, N_{u2}, N_{u3}, \ldots, N_{un}, \}$, $\{\theta_{u1}, \theta_{u2}, \theta_{u3}, \ldots, \theta_{un}\}$ are obtained.

In this case, the hearing difficulty estimation part 55 calculates the hearing difficulty score $S_u$ in consideration of the influence of each of the three parameters on the hearing difficulty at the position of the user 10 using the following equation (i=1, 2, 3, . . . , n).

$$S_u = D_{su} \times \left( \sqrt{\sum_{i=1}^{n} (N_{ui} \times f(\theta_{ui}))^2} + c \right) \qquad \text{[Equation 4]}$$

Since the voice from the voice output device 20 attenuates in sound pressure in proportion to the distance $D_{su}$, the distance $D_{su}$ is first multiplied. Note that variable c is a variable proportional to the distance $D_{su}$ for calculating the hearing difficulty score $S_u$ even when there is no noise-related term (square root term).

It is generally known that a sound pressure addition of a plurality of sound sources can be obtained by a root sum square. Accordingly, as a term related to noise, one obtained by multiplying the noise level $N_{ui}$ of the plurality of noise sources by an angular component term $f(\theta_{ui})$ depending on an angular difference $\theta_{ui}$ and taking the root sum square is used.

Note that the angular component term $f(\theta_{ui})$ is expressed by the following equation.

$$f(\theta_{ui}) = a \times \frac{\cos \theta_{ui} + 1}{2} + b \qquad \text{[Equation 5]}$$

Figure 5:
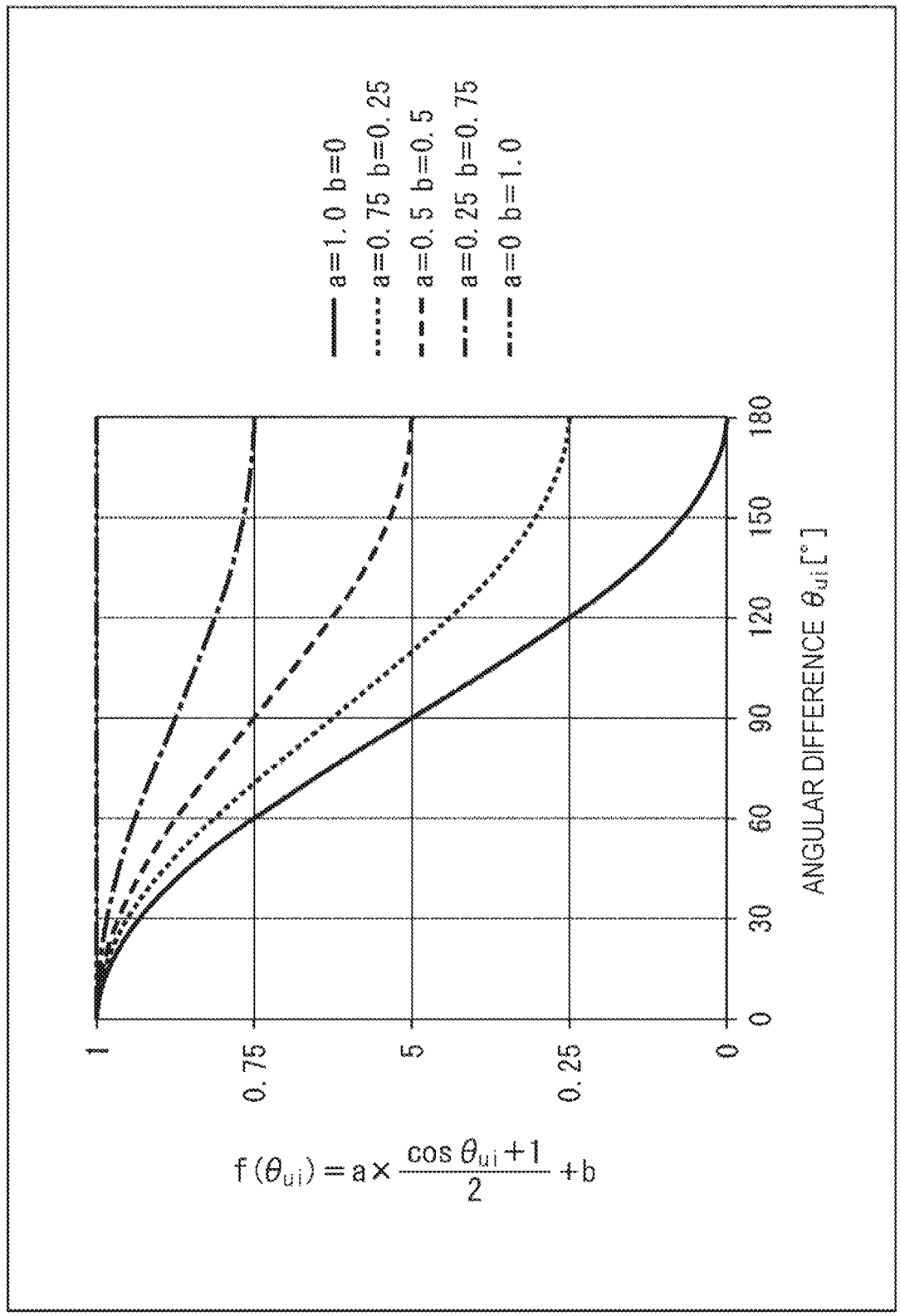
FIG. 5 is a graph explaining an angle component term of a hearing difficulty score.

The angular component term $f(\theta_{ui})$ is an example of a function having a maximum value when the angular difference $\theta_{ui}$ is 0 degrees and a minimum value when it is 180 degrees, as illustrated in FIG. 5.

In the equation, variable a is a weighting coefficient of the influence by the angular difference $\theta_{ui}$, and variable b is a weighting coefficient of the influence by noise not due to the angular difference $\theta_{ui}$. It is desirable that each of the variables a and b have a value of 0 or more, and a+b≤1.0. For example, when a=1.0 and b=0, $f(\theta_{ui})$=1.0 when $\theta_{ui}$=0°, and $f(\theta_{ui})$=0 when $\theta_{ui}$=180°. Furthermore, when a=0 and b=1.0, $f(\theta_{ui})$=1.0 regardless of $\theta_{ui}$.

Note that the variables a, b, and c described above may be configured as an application programming interface (API) as setting parameters of the hearing difficulty estimation part 55, and may be configured to be externally controllable.

The hearing difficulty score $S_u$ calculated in this manner is supplied to the voice output control part 56.

In step S15, the voice output control part 56 generates voice parameters for determining characteristics of a voice to be output toward the user 10 by using the hearing difficulty score $S_u$ calculated by the hearing difficulty estimation part 55. Here, it is assumed that voice parameters described below are generated.

(1) Volume $V_0$: a parameter calculated so that the volume (output sound pressure) increases in proportion to the hearing difficulty score $S_u$, and supplied to the voice reproduction device 60.

The volume $V_0$ is calculated, for example, using the following equation.

$$V_0 = k_v \times S_u \qquad \text{[Equation 6]}$$

In the equation, the variable $k_v$ is a proportionality factor of an added volume. Furthermore, an upper limit of the volume $V_0$ is volume $V_{max}$ determined by a restriction of the voice reproduction device 60.

Note that the variables $k_v$ and $V_{max}$ described above may be configured as API as setting parameters of the voice output control part 56 and may be configured to be externally controllable. For example, the variables $k_v$, $V_{max}$ may be set by estimating auditory characteristics of the user from attribute information such as the age of the user. Specifically, since the audible range (dynamic range) narrows as the age increases, $k_v$ is set larger and $V_{max}$ is set smaller as the age of the user is higher.

(2) Height (pitch) $P_0$: a parameter calculated so that the pitch becomes higher in proportion to the hearing difficulty score $S_u$ with respect to reference pitch $P_d$ (offset of the voice synthesis engine 58 to the reference pitch), and supplied to the voice synthesis engine 58 together with the notification speech text 57.

The pitch $P_0$ is calculated, for example, using the following equation.

$$P_0 = P_d + k_p \times S_u \qquad \text{[Equation 7]}$$

In the equation, the variable $k_p$ is a proportional coefficient of an added pitch. Furthermore, an upper limit of the pitch $P_0$ is pitch $P_{max}$ at which the voice synthesis engine 58 can maintain natural voice quality.

In a noisy environment, it is known as a Lombard effect that a person naturally raises his voice to make it easier for the other person to hear the contents of a speech. According to the Lombard effect, a person raises the volume and pitch (basic frequency and formant frequency) of the voice. Thus, with regard to the pitch $P_0$, the Lombard effect is simulated by raising the set pitch of the voice synthesis engine 58.

Note that the variables $P_d$, $k_p$, and $P_{max}$ described above may be configured as API as setting parameters of the voice output control part 56, and may be configured to be externally controllable.

(3) Speech rate $R_0$: a parameter calculated so that the speech rate becomes higher in proportion to the hearing difficulty score $S_u$ with respect to reference speech rate $R_d$ (offset of the voice synthesis engine 58 to the reference speech rate), and supplied to the voice synthesis engine 58 together with the notification speech text 57.

The speech rate $R_0$ is calculated, for example, using the following equation.

$$R_0 = R_d + k_r \times S_u \qquad \text{[Equation 8]}$$

In the equation, the variable $k_r$ is a proportionality factor of an added speech rate. Furthermore, an upper limit of the speech rate $R_0$ is speech rate $R_{max}$ that can be heard by the voice synthesis engine 58.

In a noisy environment, increasing the speech rate (or speaking more rapidly to a certain degree) makes it easier for the user to recognize cohesiveness of the entire speech, and eliminates a sense of elongation and makes the contents easier to understand. However, if the speech rate is too high, words themselves cannot be heard, and thus the speech rate is limited by the speech rate $R_{max}$.

Note that the variables $R_d$, $k_r$, and $R_{max}$ described above may be configured API as setting parameters of the voice output control part 56, and may be configured to be externally controllable.

(4) Frequency $F_0$: a parameter for emphasizing a high frequency range of a voice signal of voice synthesis performed, calculated as a lowest frequency of high-frequency emphasis signal processing, and supplied to the output voice signal processing part 59. In the high-frequency emphasis signal processing, a band above the frequency $F_0$ is emphasized.

(5) Gain $G_0$: similarly to the frequency $F_0$, this is a parameter for emphasizing a high frequency range of a voice signal of voice synthesis performed, and is calculated so that gain is increased in proportion to the hearing difficulty score $S_u$, and supplied to the output voice signal processing part 59.

The gain $G_0$ is calculated, for example, using the following equation.

$$G_0 = k_g \times S_u \qquad \text{[Equation 9]}$$

In the equation, the variable $k_g$ is a proportional coefficient of the gain. Furthermore, an upper limit of the gain $G_0$ is gain $G_{max}$ of a degree that naturalness of the voice as a voice is not lost due to that the high-frequency emphasis processing lacks too much.

It is generally known that by raising the level in the high frequency range a masked consonant is emphasized to make it easier to perceive phonology, thereby enhancing clarity of a voice. Furthermore, energy of the high frequency range (consonant) of a voice is low, and general noise in the natural world has a spectrum similar to pink noise that is high in the low frequency range and low in the high frequency range, and thus the high frequency emphasis is effective to increase the voice clarity without raising the sound volume too much.

Note that the variables $k_g$ and $G_{max}$ described above may be configured as API as setting parameters of the voice output control part 56 together with the frequency $F_0$, and may be configured to be externally controllable.

Furthermore, as another example of high frequency emphasis, the noise detection processing part 52 may obtain spectrum information of noise, the voice output control part 56 may estimate a band of sound of voice synthesis to be masked on the basis of the spectrum information of noise, and the output voice signal processing part 59 may perform a process to increase the level of the band.

(6) Intonation $I_0$: a parameter calculated so that intonation becomes smaller in proportion to the hearing difficulty score $S_u$ with respect to intonation $I_d$ as a reference (offset of the voice synthesis engine 58 to reference intonation), and supplied to the voice synthesis engine 58 together with the notification speech text 57.

The intonation $I_0$ is calculated, for example, using the following equation.

$$I_0 = I_d - k_i \times S_u \qquad \text{[Equation 10]}$$

In the equation, the variable $k_i$ is a proportionality factor of intonation. Furthermore, a lower limit of the intonation $I_0$ is intonation $I_{min}$ restricted by the voice synthesis engine 58.

Among voice synthesis engines, there are ones that allow setting the size of intonation of speech. In a noisy environment, words when the intonation is lowered are masked by noise, making it difficult to hear the entire speech. Therefore, audibility can be improved by making the speech flatter as the sound volume of noise increases (on the other hand, in an environment where noise is small and easy to hear, it is easier to understand the contents of speech if there is intonation).

Note that the variables $I_d$, $k_i$, and $I_{min}$ described above may be configured as API as setting parameters of the voice output control part 56, and may be configured to be controllable from the outside.

(7) Accent $A_0$: a parameter calculated so that an accent becomes stronger in proportion to the hearing difficulty score $S_u$ with respect to standard accent $A_d$ (offset of the voice synthesis engine 58 to the standard accent), and supplied to the voice synthesis engine 58 together with the notification speech text 57.

The accent $A_0$ is calculated, for example, using the following equation.

$$A_0 = A_d + k_a \times S_u \qquad \text{[Equation 11]}$$

In the equation, the variable $k_a$ is a proportionality factor of accent. Furthermore, an upper limit of the accent $A_0$ is accent $A_{max}$ restricted by the voice synthesis engine 58.

Among voice synthesis engines, there are ones that allow setting the accent strength of a speech. In a noisy environment, strengthening the accent enhances the intelligibility of words in an accent phrase unit and can improve audibility (on the other hand, if the accent is strengthened too much, unnaturalness of the speech becomes noticeable, and thus the accent is adapted to the hearing difficulty score $S_u$).

Note that the variables $A_d$, $k_a$, and $A_{max}$ described above may be configured as API as setting parameters of the voice output control part 56, and may be configured to be externally controllable.

As described above, voice parameters are generated.

Note that each variable used for generation of the voice parameters described above may be configured as API as a setting parameter together with the hearing difficulty score $S_u$, and a process may be performed to adapt a voice output characteristic to the context of the user (a parameter according to age, gender, attributes of the user, or the like) other than noise.

Figure 3:
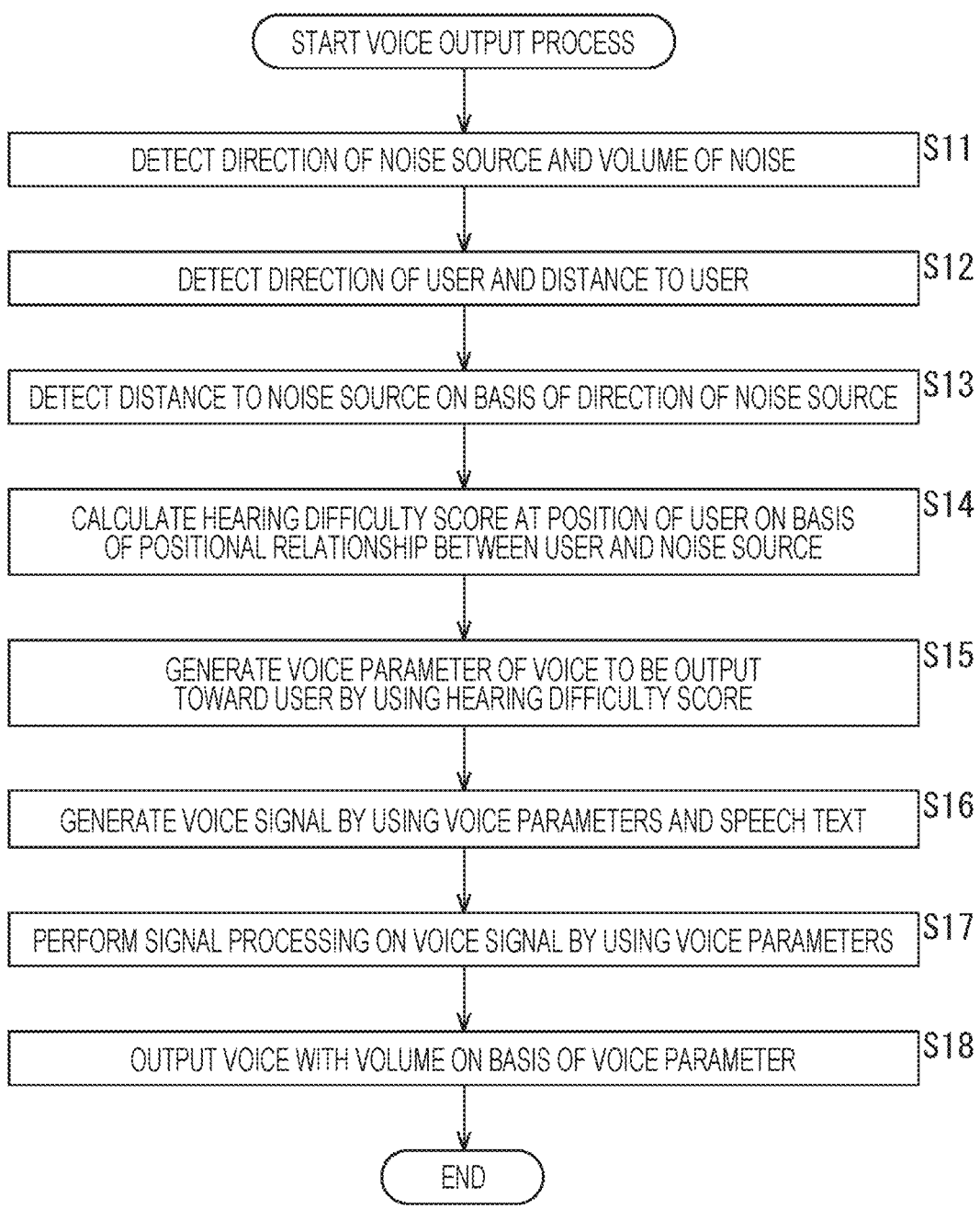
FIG. 3 is a flowchart explaining voice output processing.

Now, returning to the flowchart of FIG. 3, in step S16, the voice synthesis engine 58 performs voice synthesis using the voice parameters (pitch $P_0$, speech rate $R_0$, intonation $I_0$, and accent $A_0$) supplied together with the notification speech text 57 from the voice output control part 56, to thereby generate a voice signal.

In step S17, the output voice signal processing part 59 performs the high-frequency emphasis signal processing on the voice signal generated by the voice synthesis engine 58 by using the voice parameters (frequency $F_0$ and gain $G_0$) from the voice output control part 56.

Here, for example, signal processing using a high shelf filter that amplifies a band above a specific frequency is performed. Furthermore, as another example of high frequency emphasis, as described above, the noise detection processing part 52 may obtain noise spectral information, the voice output control part 56 may estimate a band of sound of voice synthesis to be masked on the basis of the noise spectral information, and the output voice signal processing part 59 may perform a process to raise the level of the band.

Then, in step S18, the voice reproduction device 60 adjusts the output volume of the speaker on the basis of the voice parameter (volume $V_0$) from the voice output control part 56, and outputs a voice according to the voice signal from the output voice signal processing part 59.

Note that in a case where the voice reproduction device 60 is configured to include an array speaker and can present an arbitrary sound image to the user 10 by wave-field synthesis, the hearing difficulty estimation part 55 may detect a direction in which there is least noise to the user 10, and the voice reproduction device 60 may localize a sound image of the voice according to the voice signal in this direction.

With the above processing, it is possible to hear a speech from the home agent unit regardless of where the user is.

In particular, even when the user is at a position far from the speaker and cannot perform a volume adjustment operation, the home agent unit can reliably transmit to the user a speech such as a notification to be transmitted at that time.

Furthermore, since the home agent unit performs a voice output adapted to the user who is the speech target, it is possible to prevent the volume of a voice output from the home agent unit from becoming too large and masking other environmental sounds in the home.

Specifically, it is possible to prevent a speech from the home agent unit from becoming noise to a user who is not the speech target, such as masking sounds that a person is listening to at home, or taking attention of a person concentrating on other things in a quiet environment. For example, it is possible to avoid that a speech from the home agent unit becomes noise that masks voice and music of a television or conversation between people, or disturbs study or sleep of a child. Furthermore, the privacy of individuals in the home can also be protected.

3. Second Embodiment

In recent years, there is a trend that a home agent unit collectively controls home electronic appliances due to implementation of Internet of Things (IoT) of home electronic appliances and the spread of wireless LAN environments such as Wi-Fi in homes.

Furthermore, there is a home network environment in which audio content is streamed by a connection method such as Digital Living Network Alliance (DLNA (registered trademark)) and the audio content is reproduced by another unit.

Accordingly, an embodiment in which a home agent unit and an external unit cooperate with each other will be described below.

(Cooperation Between Home Agent Unit and External Unit)

Figure 6:
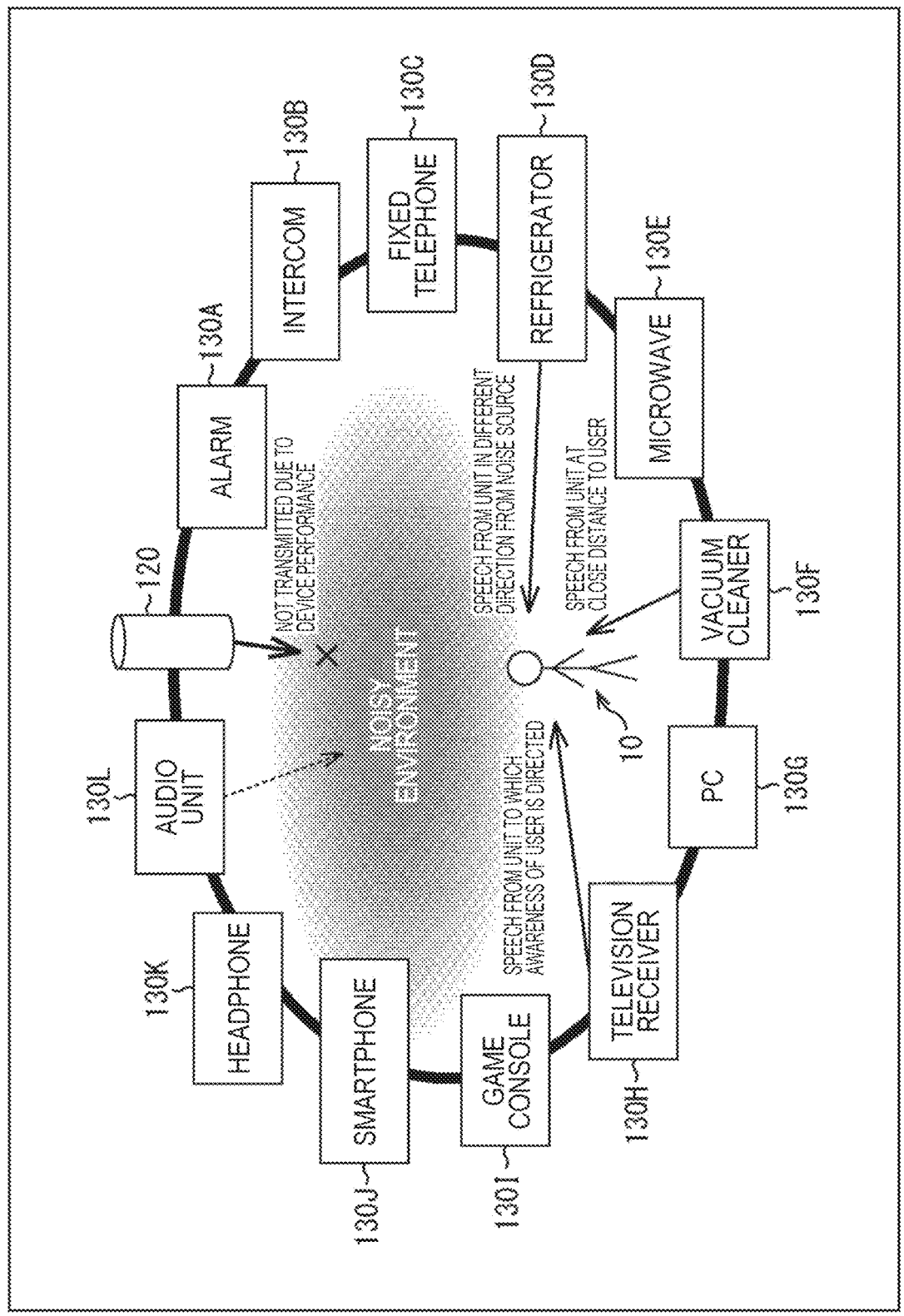
FIG. 6 is a diagram explaining cooperation with external units.

FIG. 6 illustrates a configuration example of a system in which a home agent unit and an external unit cooperate with each other.

In FIG. 6, a voice output device 120 as a home agent unit includes an alarm 130A, an intercom 130B, a fixed telephone 130C, a refrigerator 130D, a microwave 130E, a vacuum cleaner 130F, a personal computer (PC) 130G, a television receiver 130H, a game console 130I, a smartphone 130J, headphones 130K, and an audio unit 130L as external units are connected via a network such as a wireless LAN.

Each of the alarm 130A to the audio unit 130L is a unit on which a voice reproduction device capable of performing voice output such as a speaker is mounted.

The alarm 130A to the audio unit 130L transmit, to the voice output device 120, information indicating the state of the own device such as an operation by a user, an operating state, and a sensing result. Furthermore, the alarm 130A to the audio unit 130L output a voice by receiving a voice signal transmitted from the voice output device 120.

FIG. 6 illustrates a state that a sound from the audio unit 130L becomes noise and a speech from the voice output device 120 is not transmitted to a user 10.

As described above, when noise (hearing difficulty) at the position of the user 10 is large and it is determined that the user 10 cannot hear a voice output from the voice output device 120 even if characteristics of the voice are adapted to the hearing difficulty as much as possible, the voice output device 120 supplies a voice signal to an external unit capable of performing a speech to the user 10 among the alarm 130A to the audio unit 130L, and the external unit outputs the voice.

In the example of FIG. 6, by estimating a behavior of the user 10 (what the user is concentrated on) from a use state of the external units, it is determined that external units capable of performing a speech to the user 10 are the television receiver 130H to which awareness of the user 10 is directed, the vacuum cleaner 130F closer to the user 10, and the refrigerator 130D in a direction different from the noise source.

Hereinafter, the alarm 130A to the audio unit 130L are simply referred to as the external unit 130 when it is not necessary to distinguish them. Note that the external unit 130 cooperating with the voice output device 120 may be a plurality of units as illustrated in FIG. 6, or may be one unit.

(Example of Functional Configurations of Voice Output Device and External Unit)

Figure 7:
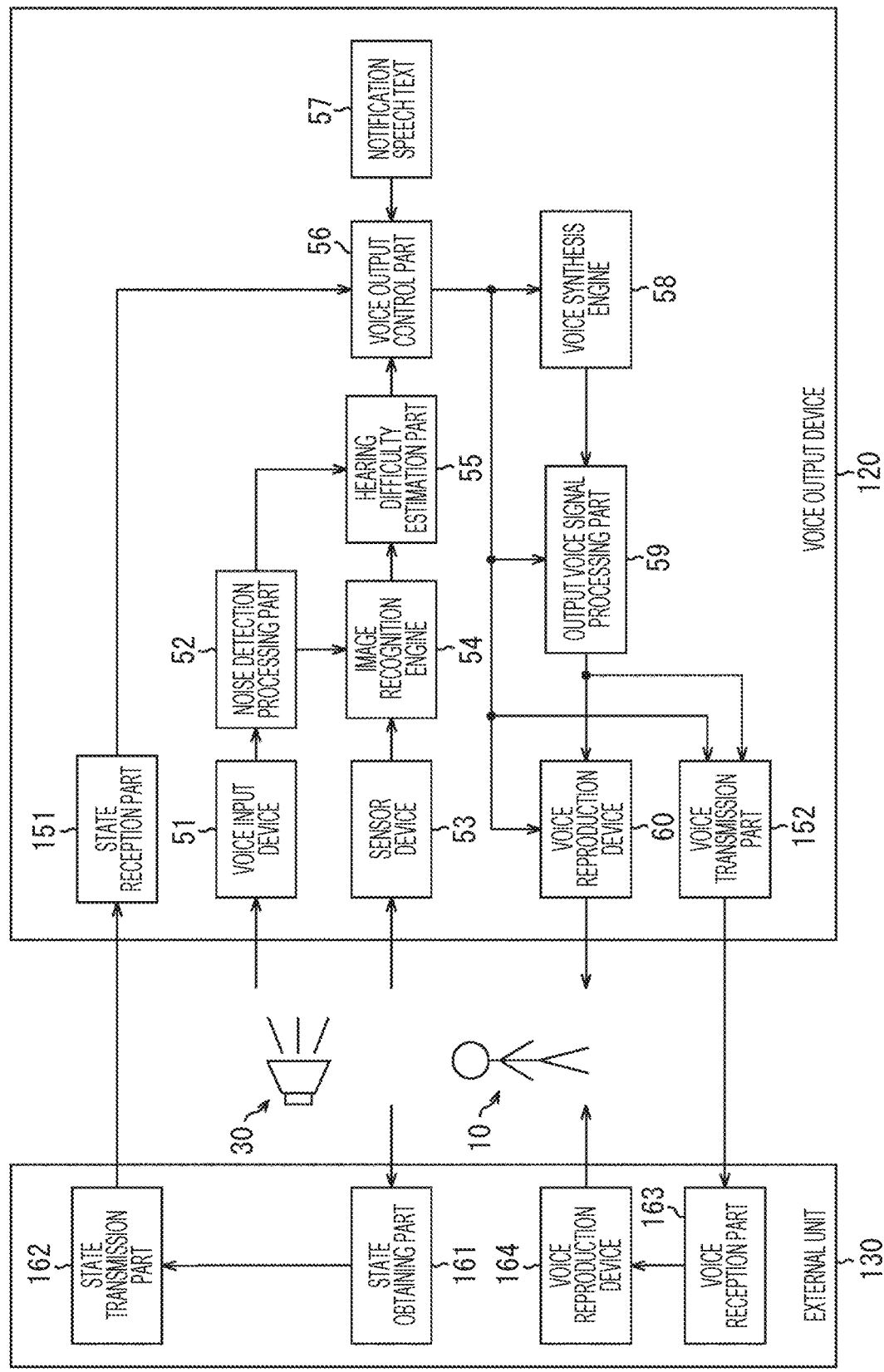
FIG. 7 is a block diagram illustrating an example of functional configurations of a voice output device and an external unit.

FIG. 7 illustrates a functional configuration example of the voice output device 120 and the external unit 130 of the second embodiment to which the present technology is applied.

The voice output device 120 includes a state reception part 151 and a voice transmission part 152 in addition to a similar configuration to the voice output device 20 of FIG. 2. Furthermore, the external unit 130 includes a state obtaining part 161, a state transmission part 162, a voice reception part 163, and a voice reproduction device 164.

Hereinafter, configurations and operations different from those of the first embodiment will be described.

The image recognition engine 54 detects a position (distance and direction) of each of the plurality of external units 130, and supplies information of the position to the hearing difficulty estimation part 55.

For example, a unique marker is attached to a surface of each of the external units 130. The image recognition engine 54 performs image recognition on an image captured by the sensor device 53 at a time of setup for linking the voice output device 120 and the external unit 130, and detects each marker. The image recognition engine 54 calculates a direction (angle) of the external unit 130 from the position of the detected marker in the image, and calculates a distance to the external unit 130 from depth information of the position. This processing is not limited to a time of setup, and may be performed at a timing immediately before the voice output device 120 performs a notification speech.

Furthermore, as processing not using the marker as described above, at a time of setup, the voice input device 51 may collect sounds for position detection output by the external units 130 in an environment without noise, and the noise detection processing part 52 may detect directions of the sounds for position detection, thereby causing the image recognition engine 54 to calculate the direction (angle) of the external unit 130 and the distance to the external unit 130.

The hearing difficulty estimation part 55 calculates a hearing difficulty score $S_e$ that indicates the hearing difficulty of the voice from each of the external units 130 at the position of the user 10 by using the information indicating the distance to and angle with each of the external units 130 from the image recognition engine 54.

Figure 8:
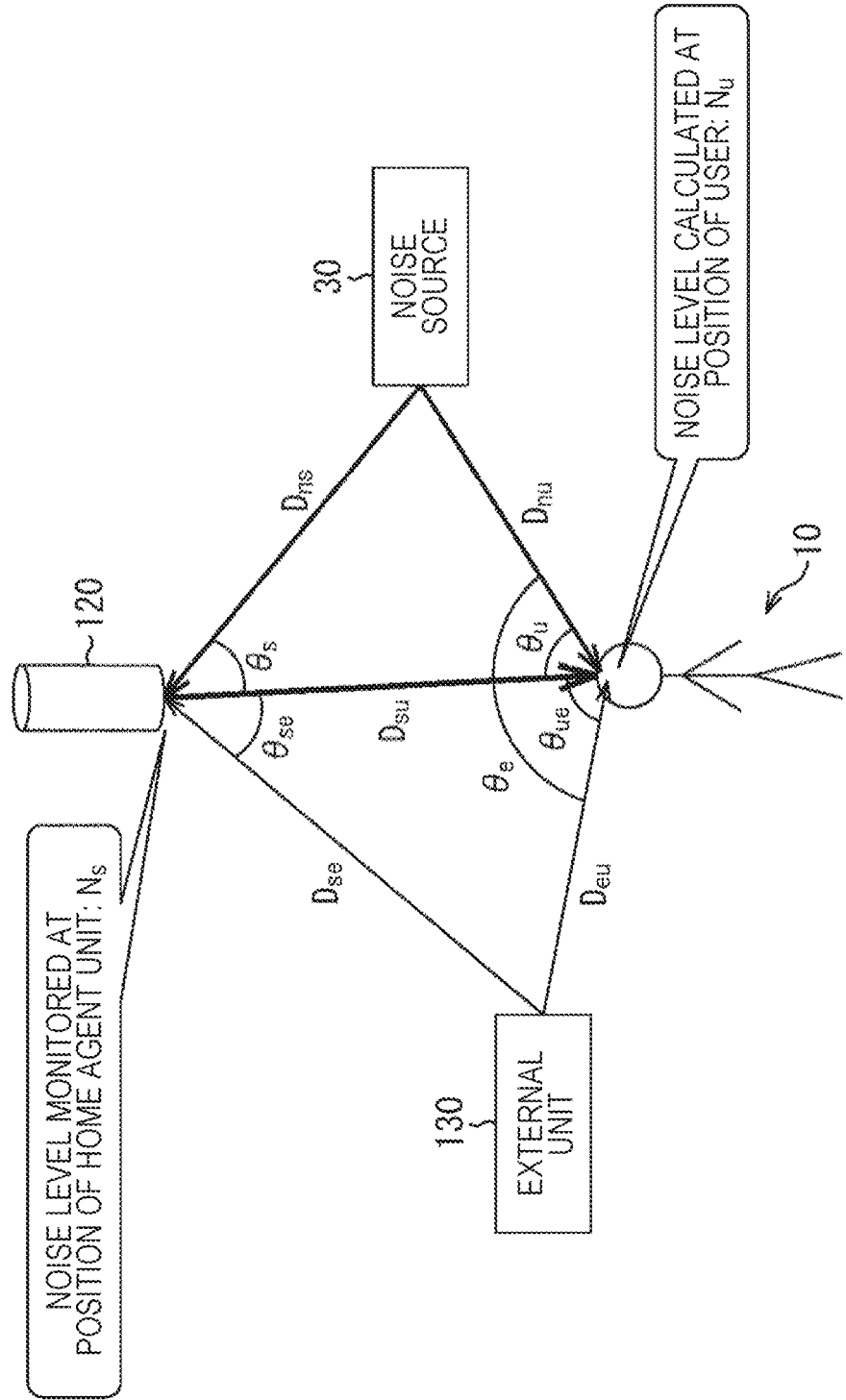
FIG. 8 is a diagram illustrating a positional relationship among a user, a voice output device, a noise source, and an external unit.

Here, as illustrated in FIG. 8, the distance to the external unit 130 is $D_{se}$, and the angular difference between the user 10 and the external unit 130 as viewed from the voice output device 120 is $\theta_{se}$. Other values are similar to the values illustrated in FIG. 4.

First, the hearing difficulty estimation part 55 calculates a distance $D_{eu}$ between the external unit 130 and the user 10 by using the following equation according to the cosine theorem.

$$D_{eu} = \sqrt{D_{se}^2 + D_{su}^2 - 2 \times D_{se} \times D_{su} \times \cos\theta_{se}}$$ [Equation 12]

Next, the hearing difficulty estimation part 55 calculates an angular difference $\theta_{ue}$ between the voice output device 20 and the external unit 130 as viewed from the user 10 by using the following equation according to the cosine theorem.

$$\theta_{ue} = \cos^{-1}\left(\frac{D_{su}^2 + D_{eu}^2 - D_{se}^2}{2 \times D_{su} \times D_{eu}}\right)$$ [Equation 13]

Moreover, the hearing difficulty estimation part 55 calculates an angular difference $\theta_e$ between the external unit 130 and the noise source 30 as viewed from the user 10.

Here, as illustrated in FIG. 8, in a case where the signs of the angular difference $\theta_s$ between the user 10 and the noise source 30 as viewed from the voice output device 120 and the angular difference $\theta_{se}$ between the user 10 and the external unit 130 as viewed from the voice output device 120 are different (the noise source 30 and the external unit 130 are on different sides with respect to a line connecting the voice output device 120 and the user 10), the angular difference between the external unit 130 and the noise source 30 as seen from the user 10 is denoted by $\theta_e = \theta_{ue} + \theta_u$.

Figure 9:
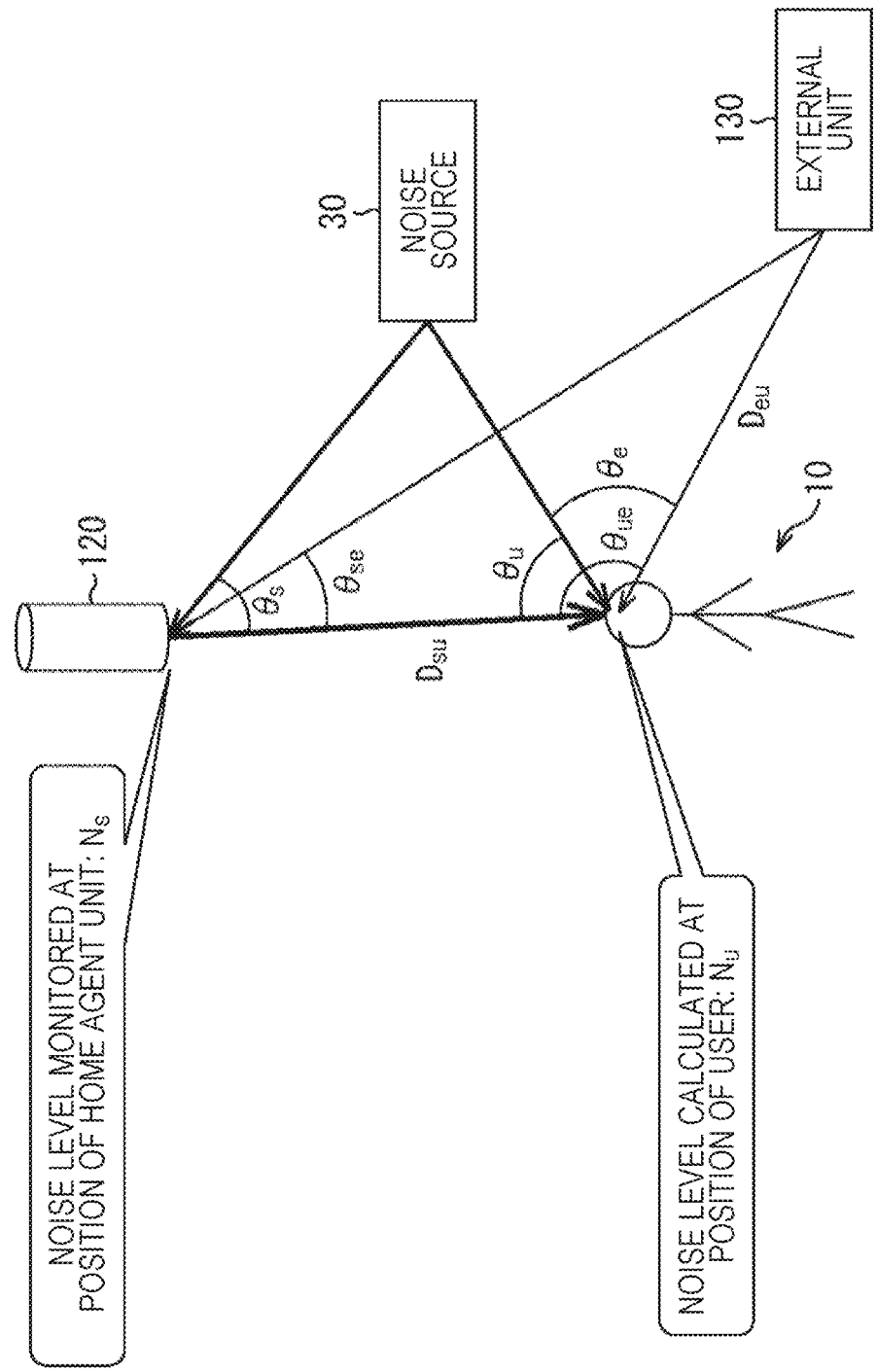
FIG. 9 is a diagram illustrating a positional relationship between a user, a voice output device, a noise source, and an external unit.

On the other hand, as illustrated in FIG. 9, in a case where the signs of the angular difference $\theta_s$ between the user 10 and the noise source 30 as viewed from the voice output device 120 and the angular difference $\theta_{se}$ between the user 10 and the external unit 130 as viewed from the voice output device 120 are the same (the noise source 30 and the external unit 130 are on the same side with respect to the line connecting the voice output device 120 and the user 10), the angular difference between the external unit 130 and the noise source 30 as seen from the user 10 is denoted by $\theta_e = |\theta_{ue} - \theta_u|$.

Note that in a case where n noise sources are present, the noise level $N_u$ at the position of the user 10 and the angular difference $\theta_e$ between the external unit 130 and the noise source 30 as seen from the user 10 are calculated for each of the noise sources, thereby obtaining $\{N_{u1}, N_{u2}, N_{u3}, \ldots, N_{un}\}$, $\{\theta_{e1}, \theta_{e2}, \theta_{e3}, \ldots, \theta_{en}\}$.

In this case, the hearing difficulty estimation part 55 calculates the hearing difficulty score $S_e$ using the following equation (i=1, 2, 3, . . . , n).

$$S_e = D_{eu} \times \left(\sqrt{\sum_{i=1}^{n}(N_{ui} \times f(\theta_{ei}))^2} + c\right)$$ [Equation 14]

$$f(\theta_{ei}) = a \times \frac{\cos\theta_{ei} + 1}{2} + b$$ [Equation 15]

The hearing difficulty score $S_e$ is calculated by a similar method to that of the hearing difficulty score $S_u$ of the voice from the voice output device 20 at the position of the user 10 described above. The hearing difficulty score $S_e$ takes a smaller value as the distance between the position of the user 10 and the external unit 130 is closer and the directions of the noise source 30 and the external unit 130 are more different.

The hearing difficulty score $S_e$ thus calculated is supplied to the voice output control part 56.

Furthermore, in a case where m external units 130 are linked to the voice output device 120, $\{S_{e1}, S_{e2}, S_{e3}, \ldots, S_{em}\}$ are obtained by calculating the hearing difficulty score $S_e$ for each of the external units 130 and are supplied to the voice output control part 56. Note that the hearing difficulty score $S_e$ of the external unit 130 that is linked to the voice output device 120 but has a position that has not been detected by the image recognition engine 54 may be replaced with the hearing difficulty score $S_u$ with respect to the voice output device 20.

Referring back to FIG. 7, the state obtaining part 161 of the external unit 130 determines whether or not the awareness of the user 10 is concentrated on the external unit 130 on the basis of the use state of the external unit 130, and the like, and supplies an awareness level indicating the degree of the awareness to the state transmission part 162.

The awareness level is divided into three steps of levels 2, 1, and 0 as described below, and the larger the number is, the higher the degree of concentration of the user 10 on the external unit 130 is.

Level 2 indicates a state that the user 10 is operating or working near the external unit 130 and, for example, the following states are conceivable.

A keyboard and a mouse of a PC are operated.
A controller of a game machine is operated and the user 10 is playing.
The user 10 is talking on a fixed telephone or an interphone.
A door of a refrigerator is open.
A rice cooker is in operation, and its lid is open.
A handy type vacuum cleaner is in operation.

Level 1 indicates that the user 10 is passively receiving audio from the external unit 130. For example, the following states are conceivable.

A video and audio are output on a television.
Audio is being output on a radio.
Music is being played on an audio unit.

Level 0 indicates a state that the awareness of the user 10 is not directed to the external unit 130, which is a state that the above-described state is not detected.

The state transmission part 162 transmits the awareness level from the state obtaining part 161 to the voice output device 120 via a network such as a wireless LAN.

On the other hand, the state reception part 151 of the voice output device 120 receives the awareness level transmitted from the external unit 130 via the network, and supplies the awareness level to the voice output control part 56.

Note that the state obtaining part 161 may obtain only the information indicating the use state of the external unit 130, the state transmission part 162 may transmit the information to the voice output device 120, and the voice output device 120 (state reception part 151) side may perform determination of the awareness level.

Now, the voice output control part 56 of the voice output device 120 determines a unit that performs a notification speech (hereinafter called a voice output unit) on the basis of the hearing difficulty score $S_u$ of a voice from the voice output device 120 at the position of the user 10 from the hearing difficulty estimation part 55 and the hearing difficulty score $\{S_{e1}, S_{e2}, S_{e3}, \ldots, S_{em}\}$ of a voice from each of the external units 130 at the position of the user 10, and the awareness level from the state reception part 151.

Then, when the external unit 130 is determined as the voice output unit by the voice output control part 56, a voice signal subjected to signal processing in the output voice signal processing part 59 is supplied to the voice transmission part 152 together with the voice parameter (volume $V_O$) generated in the voice output control part 56.

The voice transmission part 152 transmits the voice signal from the output voice signal processing part 59 to the external unit 130 determined as the voice output unit together with the voice parameter from the voice output control part 56 via a network such as a wireless LAN.

The voice reception part 163 of the external unit 130 receives the voice signal and the voice parameter from the voice output device 120, and supplies the voice signal and the voice parameter to the voice reproduction device 164.

The voice reproduction device 164 is configured similarly to the voice reproduction device 60, and outputs a voice according to the voice signal from the voice output device 120 at a volume based on the voice parameter (volume $V_O$) from the voice output device 120.

(Voice Output Unit Determination Processing)

Figure 10:
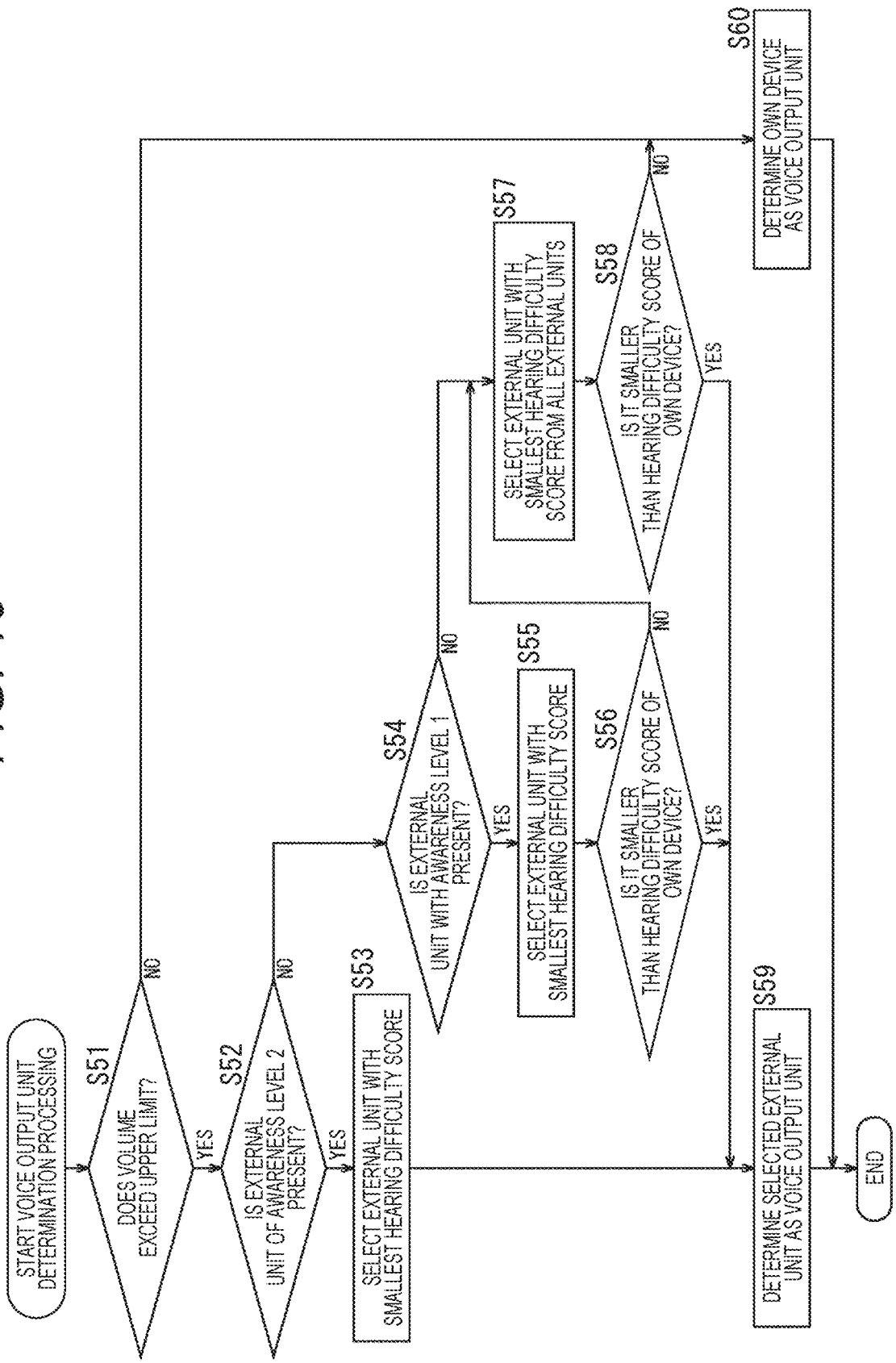
FIG. 10 is a flowchart explaining a voice output unit determination processing.

Here, details of the voice output unit determination processing executed by the voice output control part 56 will be described with reference to a flowchart of FIG. 10. The processing of FIG. 10 is started at a timing when (immediately before) a notification speech is performed.

In step S51, the voice output control part 56 compares a volume $V_O$ calculated using a hearing difficulty score $S_u$ with a volume $V_{max}$ determined by a restriction of the voice reproduction device 60, and determines whether or not the volume $V_O$ exceeds the upper limit (volume $V_{max}$) of the output volume of the voice reproduction device 60. If it is determined that the volume $V_O$ exceeds the upper limit, the process proceeds to step S52.

In step S52, the voice output control part 56 determines whether or not an external unit 130 of awareness level 2 is present on the basis of the awareness level of each of the external units 130 supplied from the state reception part 151. If it is determined that the external unit 130 of awareness level 2 is present, the process proceeds to step S53.

In step S53, the voice output control part 56 selects the external unit 130 with the smallest hearing difficulty score $S_e$ from the external units 130 of awareness level 2, and the process proceeds to step S59.

On the other hand, when it is determined in step S53 that the external unit 130 of awareness level 2 is not present, the process proceeds to step S54.

In step S54, the voice output control part 56 determines whether or not an external unit 130 of awareness level 1 is present on the basis of the awareness level of each of the external units 130 supplied from the state reception part 151. If it is determined that the external unit 130 of awareness level 1 is present, the process proceeds to step S55.

In step S55, the voice output control part 56 selects an external unit 130 with the smallest hearing difficulty score $S_e$ among the external units 130 of awareness level 1.

In step S56, the voice output control part 56 compares the hearing difficulty score $S_e$ of the selected external unit 130 with the hearing difficulty score $S_u$ of the own device (the voice output device 120), and determines whether or not the hearing difficulty score $S_e$ of the external unit 130 is smaller than the hearing difficulty score $S_u$ of the own device. If it is determined that the hearing difficulty score $S_e$ is smaller than the hearing difficulty score $S_u$, the process proceeds to step S59.

Now, if it is determined in step S54 that the external unit 130 of awareness level 1 is not present, or if it is determined in step S56 that the hearing difficulty score $S_e$ is not smaller (is larger) than the hearing difficulty score $S_u$, the process proceeds to step S57.

In step S57, the voice output control part 56 selects the external unit 130 with the smallest hearing difficulty score $S_e$ from all the external units 130 linked to the voice output device 120.

In step S58, the voice output control part 56 compares the hearing difficulty score $S_e$ of the selected external unit 130 with the hearing difficulty score $S_u$ of the own device (voice output device 120), and determines whether or not the hearing difficulty score $S_e$ of the external unit 130 is smaller than the hearing difficulty score $S_u$ of the own device. If it is determined that the hearing difficulty score $S_e$ is smaller than the hearing difficulty score $S_u$, the process proceeds to step S59.

In step S59, the voice output control part 56 determines the external unit 130 selected in step S53, S55, or S57 as a voice output unit.

On the other hand, if it is determined in step S51 that the volume $V_O$ does not exceed the upper limit, or if it is determined in step S58 that the hearing difficulty score $S_e$ is not smaller (is larger) than the hearing difficulty score $S_u$, the process proceeds to step S60.

In step S60, the voice output control part 56 determines the own device (voice output device 120) as the voice output unit.

In this manner, the voice output unit that performs a notification speech is determined on the basis of the hearing difficulty score $S_u$ of the own device and the hearing difficulty score $S_e$ and awareness level of each of the external units 130.

With the above configuration and processing, even when the volume of a voice to be output exceeds the performance limit of a voice reproduction device (speaker) of the home agent unit, a notification speech can be reliably transmitted to the user via a linked external unit according to the location of the user.

Furthermore, even if the user concentrates on other things and is in a situation where it is difficult to notice a speech from the home agent unit, the notification speech can be reliably transmitted to the user by outputting a voice from the external unit to which the awareness of the user is directed.

Moreover, regarding a notification speech with high urgency, without waiting until the noise level becomes low or there is a situation that the user easily notices the speech from the home agent unit, the notification speech can be reliably transmitted to the user.

(Example of Case where User Moves During Speech of Home Agent Unit)

In the present embodiment, in a case where the user moves during a speech of the voice output unit (home agent unit or external unit), the voice output unit may be dynamically switched following a change in position of the user.

In this case, the processing from sensing by the voice input device 51 and the sensor device 53 up to calculation of the hearing difficulty score $S_u$ of the voice output device 120 and the hearing difficulty scores $\{S_{e1}, S_{e2}, S_{e3}, \ldots, S_{em}\}$ for each of the m external units 130 is performed not only at a timing of start of a speech of the voice output unit but also in real time during the speech, and the calculated hearing difficulty scores $S_u$ and $\{S_{e1}, S_{e2}, S_{e3}, \ldots, S_{em}\}$ are supplied to the voice output control part 56.

A time granularity of the processing performed in real time during a speech of the voice output unit is, for example, an imaging frame rate of the camera constituting the sensor device 53 (in other words, the time granularity of recognition process of the image recognition engine 54). When the frame rate is, for example, 30 fps, the hearing difficulty scores $S_u$ and $\{S_{e1}, S_{e2}, S_{e3}, \ldots, S_{em}\}$ are calculated every 1/30 seconds during a speech of the voice output unit, and are supplied to the voice output control part 56.

The voice output control part 56 executes the voice output unit determination processing described with reference to FIG. 10 not only at the timing of start of a speech of the voice output unit, but also during the speech, by using the hearing difficulty score $S_u$ of the voice output device 120 and the hearing difficulty scores $\{S_{e1}, S_{e2}, S_{e3}, \ldots, S_{em}\}$ for each of the external units 130, which are updated in real time.

The device determined by the voice output unit determination processing is switched when the hearing difficulty scores $S_u$ and $\{S_{e1}, S_{e2}, S_{e3}, \ldots, S_{em}\}$ change due to movement of the user 10 during speech of the unit determined as the voice output unit.

Here, with reference to FIGS. 11 to 13, an example in which the voice output unit is switched from an external unit A to an external unit B will be described.

Figure 11:
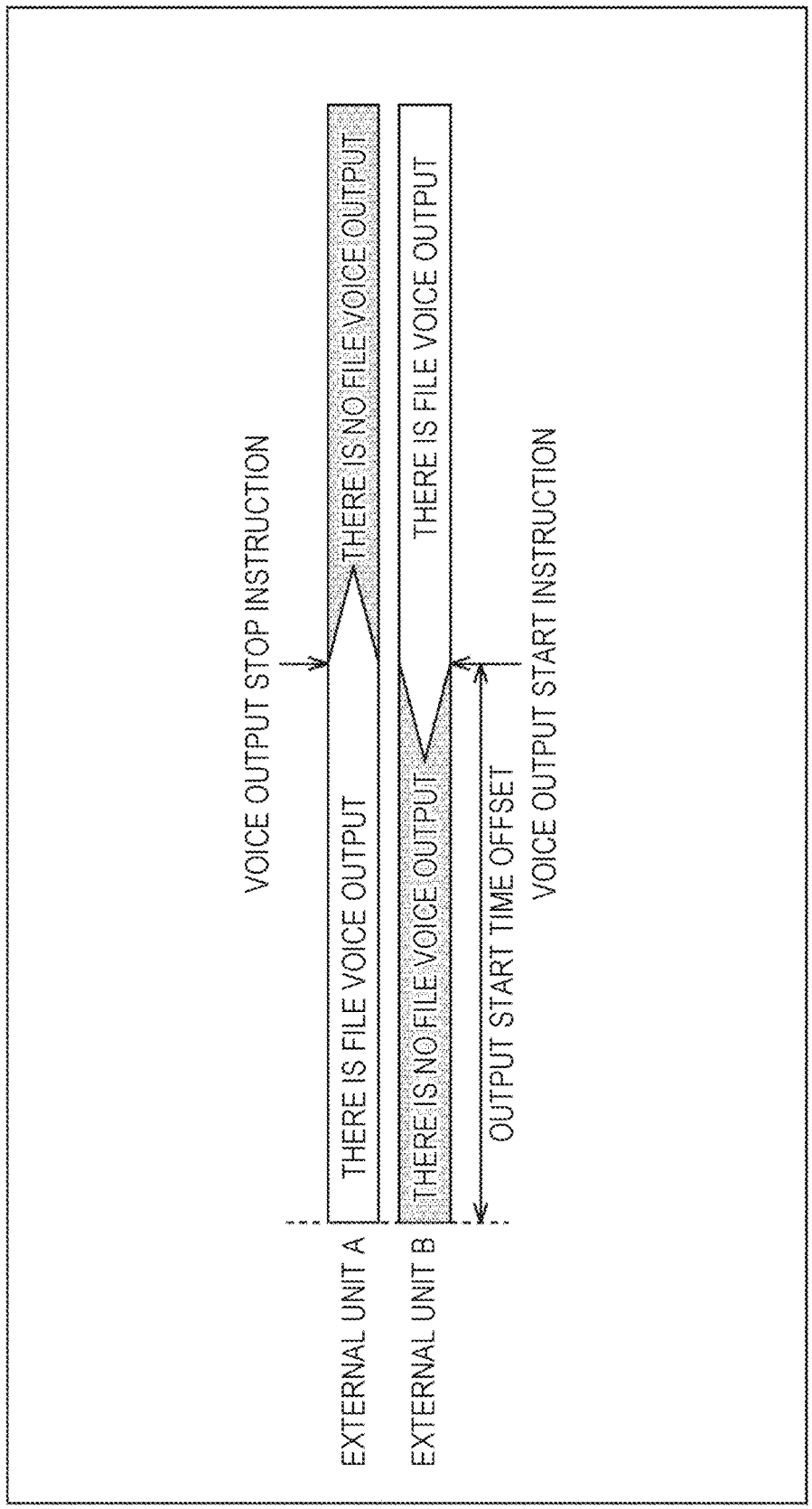
FIG. 11 is a diagram illustrating an example of switching of a voice output unit.

FIG. 11 illustrates an example of switching of the voice output unit when a file of speech voice is transmitted from the voice output device 120 to the voice output unit.

The voice output device 120 instructs the external unit A to stop (discontinue) a voice output. The external unit A starts fade out of the voice output from the timing when the voice output stop instruction is received, and stops the voice output by completing the fade out over several seconds.

On the other hand, the voice output device 120 instructs the external unit B to start voice output by transmitting the file of speech voice and an output start time offset in the file to the external unit B (time when the voice output stop is given in instruction to the external unit A) simultaneously with the voice output stop instruction to the external unit A. The external unit B starts fade in from a position specified by the output start time offset of the file of speech voice and completes the fade in over several seconds to start the voice output.

Figure 12:
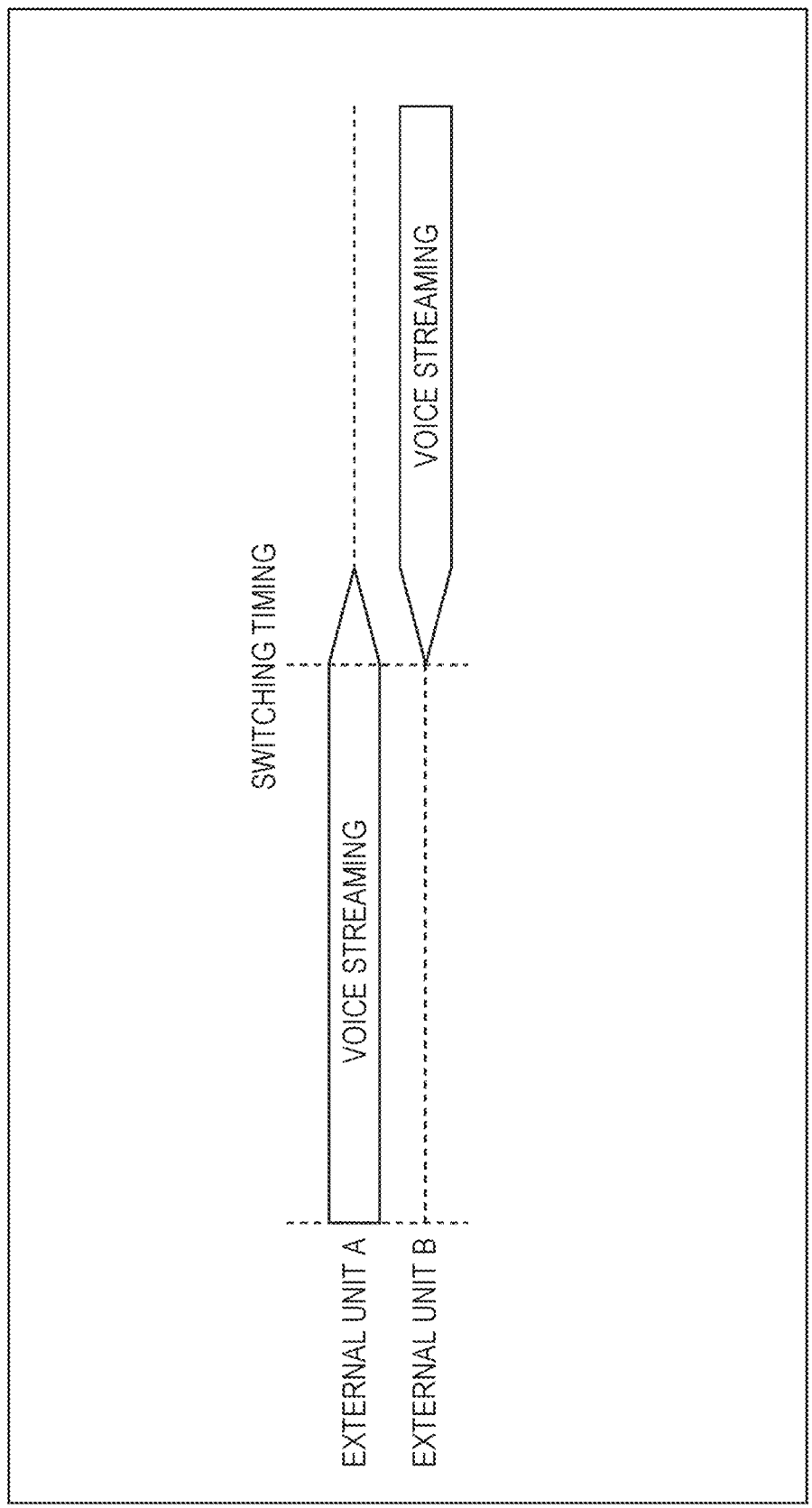
FIG. 12 is a diagram illustrating an example of switching of a voice output unit.

FIG. 12 illustrates an example of switching of a voice output unit in a case of streaming a speech voice from the voice output device 120 to the voice output unit.

The voice output device 120 starts fade out of voice streaming to the external unit A and simultaneously starts fade in of voice streaming to the external unit B. The voice output device 120 completes switching of the voice output unit by completing the fade out of the audio streaming to the external unit A and the fade in of the audio streaming to the external unit B over several seconds.

Figure 13:
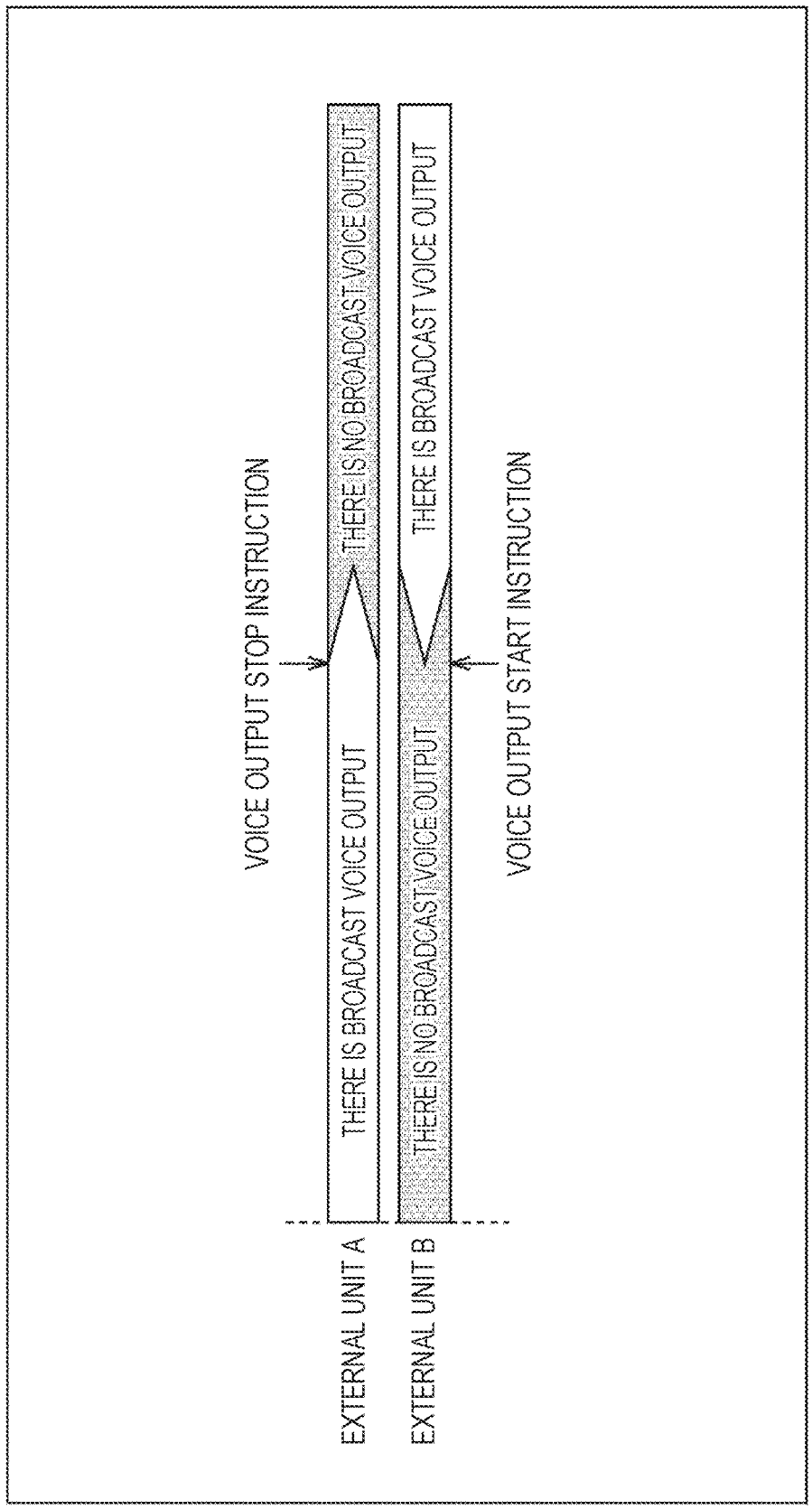
FIG. 13 is a diagram illustrating an example of switching of a voice output unit.

FIG. 13 illustrates an example of switching of the voice output unit in a case where the voice output device 120 broadcasts a speech voice to all the external units.

In a state that a speech voice is broadcast to both of the external units A and B, the voice output device 120 simultaneously instructs the external unit A to stop the voice output and the external unit B to start the voice output. From the timing when the instruction is received, the external unit A starts fade out of the voice output, and the external unit B starts fade in of the voice output. The switching of the voice output unit is completed by the external unit A completing the fade out and the external unit B completing the fade in over several seconds.

(Example of Case where Home Agent Unit Cannot Detect User)

In the present embodiment, in a case where the home agent unit cannot detect the user because the user is not present around the home agent unit, and an external unit located near the user detects the user, it is also possible to determine this external unit as the voice output unit.

When the home agent unit cannot detect the user, the position of the user is unknown, and thus the hearing difficulty scores $S_u$ and $S_e$ at the position of the user cannot be calculated.

Accordingly, as an exceptional process for calculating the hearing difficulty scores, the hearing difficulty score $S_u$ for the voice output device 120 and the hearing difficulty score $S_e$ for the external unit 130 having not detected the user are set to have large values so that $V_O > V_{max}$. Moreover, the hearing difficulty score $S_e$ for the external unit 130 having detected the user is set to have a smaller value than the hearing difficulty score $S_u$ for the voice output device 120 and the hearing difficulty score $S_e$ for the external unit 130 having not detected the user. In other words, the hearing difficulty score for the external unit 130 having detected the user is made smaller than the hearing difficulty score for the other units.

With such setting of hearing difficulty scores, the external unit 130 having detected the user is determined as the voice output unit in the voice output unit determination processing described with reference to FIG. 10, and a speech voice is output from this external unit 130.

For example, it is assumed that although a home agent unit is installed in a living room on the first floor, no one is present in the living room, the user is in a bedroom on the second floor, and a camera installed in a PC (external unit) placed in the bedroom detects the user. In this case, the PC is determined as the voice output unit, the home agent unit does not output a speech voice, and the PC outputs the speech voice. Thus, the notification speech can be reliably transmitted to the user in the bedroom on the second floor.

(Other Modification Examples)

In the present embodiment, the home agent unit (voice output device 120) may be able to detect that headphones or earphones are connected to an external unit determined as a voice output unit. In this case, a speech voice is output from both the external unit and the home agent unit.

Because headphones and earphones cannot emit sound to the outside, even when the user does not wear the headphones or earphones connected to the external unit, the above-described configuration can reliably transmit a notification speech to the user.

A sound effect may also be added to the beginning of a speech. In this case, the sound effect is output also from the external unit, and the user is made to recognize that a notification speech of the home agent unit is output.

The content of a notification speech text may be changed between when a voice is output from the home agent unit and when a voice is output from an external unit.

For example, when providing notification of the status of the home agent unit main body, the speech output from the home agent unit main body is "updating" and the speech output from the external unit is "updating the home agent unit".

Furthermore, when providing additional information according to the position of the user, the speech output from the home agent unit main body is "please look at the screen" and the speech output from the external unit is "please look at the screen in front of the home agent unit". At this time, additional information is projected by a projector provided in the home agent unit.

When the position of the user is not detected from images captured by the cameras included in external units, a speech voice may be output from all the external units.

When the noise level is very high and the hearing difficulty score exceeds a certain value, notification information may be presented by means other than voice. For example, a text of notification message is displayed on a screen of a visual presentation device provided in the home agent unit, a television receiver as an external unit, or the like. Furthermore, in a case where the external unit is a smartphone, the notification may be performed by a vibration function of the smartphone.

Particularly for a notification with high urgency, a speech may be repeatedly performed with a voice having characteristics determined by raising the hearing difficulty score $S_u$ of the voice output device 120 until a confirmation action by a voice or gesture of the user is detected. Moreover, when the confirmation action is not detected, the speech may be performed in order from the external unit with a low hearing difficulty score $S_e$.

4. Third Embodiment

The present technology can also be applied to cloud computing.

Figure 14:
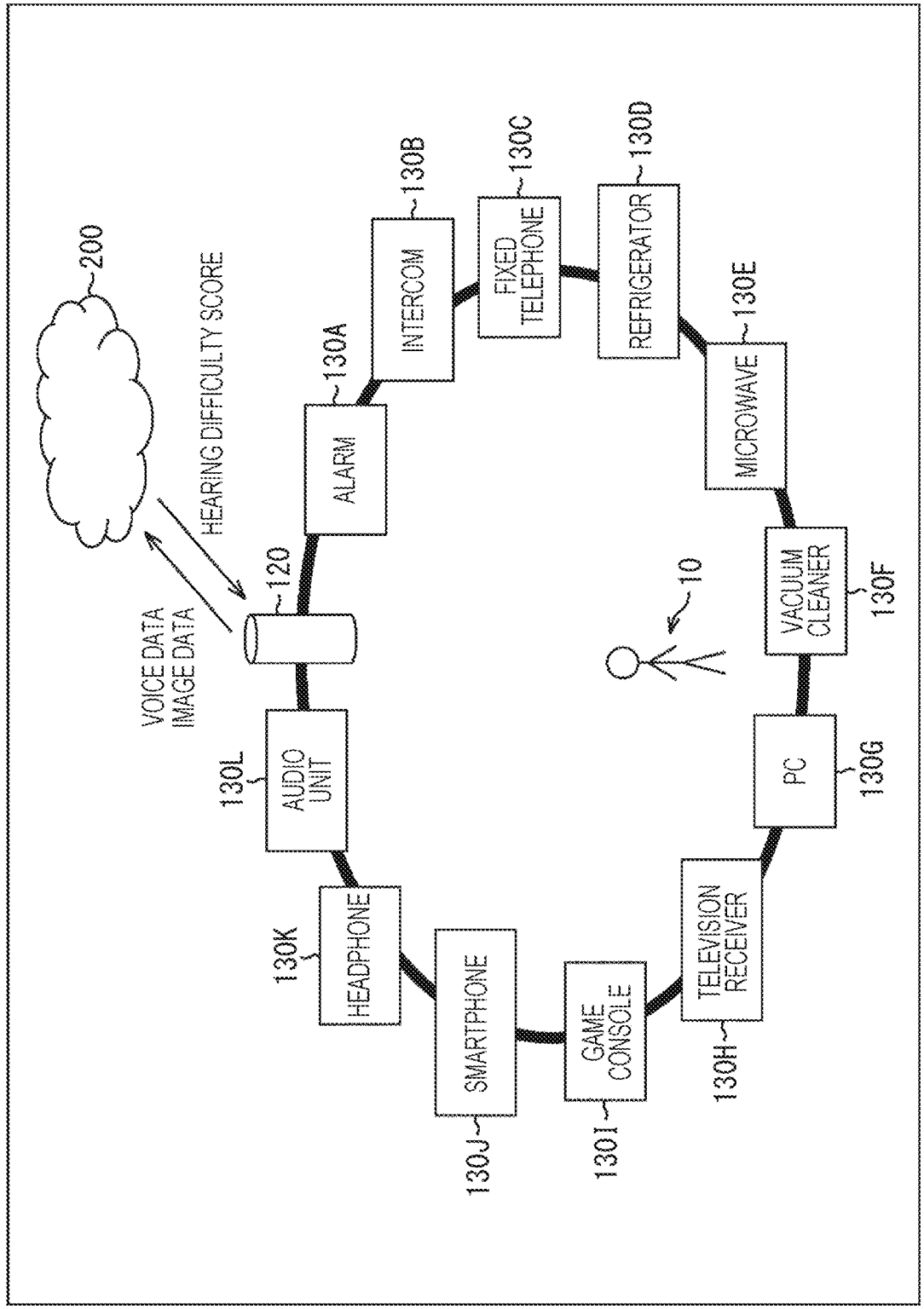
FIG. 14 is a diagram explaining an application to cloud computing.

For example, as illustrated in FIG. 14, a voice output device 120 transmits voice data and image data obtained by sensing of the own device or an external unit 130 to a server on cloud 200.

In the server on the cloud 200, a hearing difficulty score (information indicating the hearing difficulty) is calculated similarly to the above-described embodiment. The calculated hearing difficulty score is transmitted to the voice output device 120.

The voice output device 120 performs processing after generation of voice parameters in a similar manner to the above-described embodiment by using the hearing difficulty score from the server on the cloud 200.

(Functional Configuration Example of Server)

Figure 15:
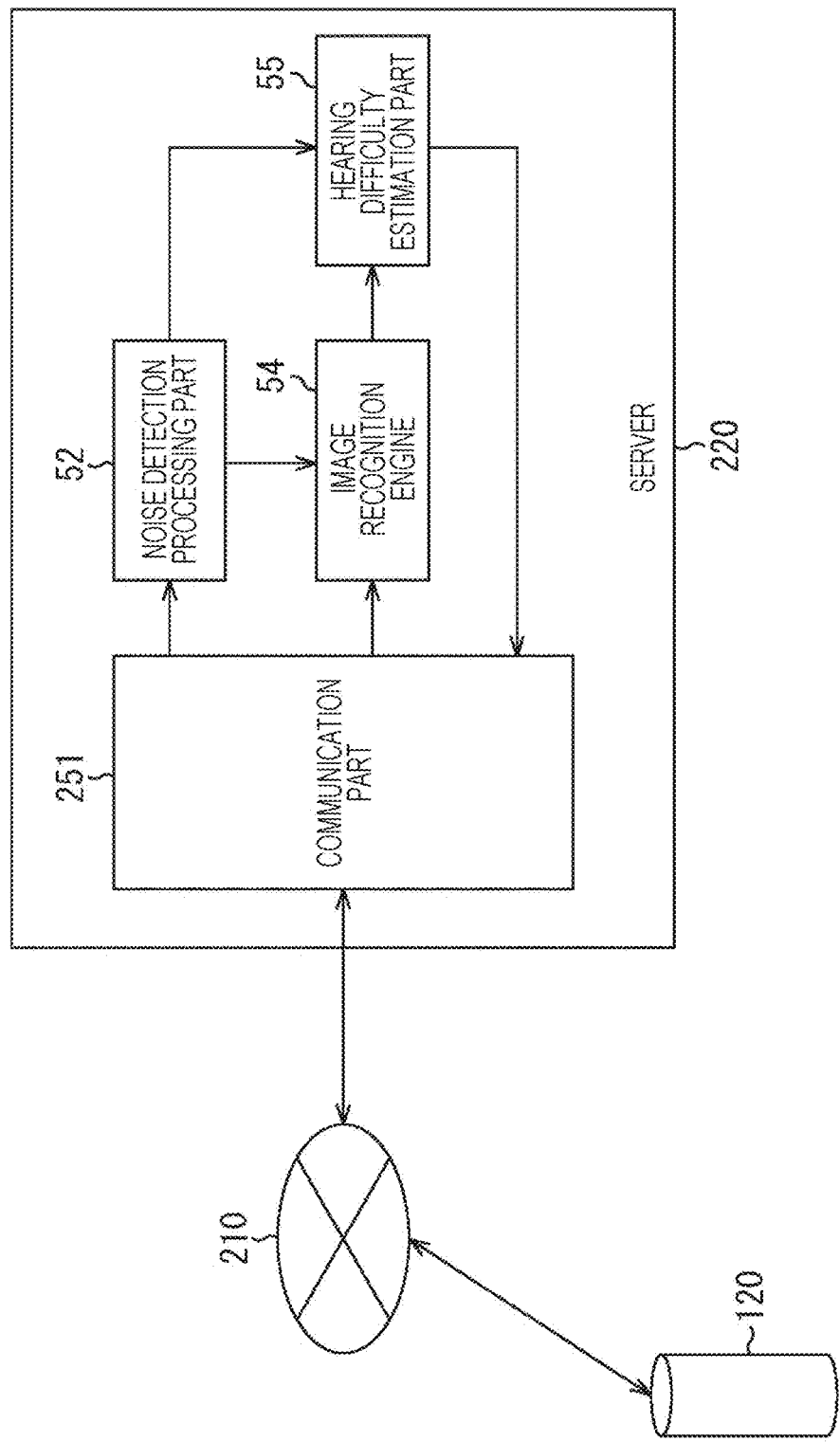
FIG. 15 is a block diagram illustrating an example of a functional configuration of a server to which the present technology is applied.

FIG. 15 illustrates an example of a functional configuration of a server of a third embodiment to which the present technology is applied.

As described in FIG. 15, a voice output device 120 is connected to a server 220 via a network 210.

The server 220 includes a noise detection processing part 52, an image recognition engine 54, a hearing difficulty estimation part 55, and a communication part 251.

The communication part 251 receives voice data and image data transmitted from the voice output device 120 via the network 210.

The processing performed by the noise detection processing part 52, the image recognition engine 54, and the hearing difficulty estimation part 55 is processing configured as so-called Web API. By this processing, information indicating hearing difficulty of the voice output device 120 and the external unit 130 is calculated and output on the basis of voice data and image data from the voice output device 120.

The communication part 251 transmits the information indicating hearing difficulty to the voice output device 120 via the network 210.

Here, it is assumed that the information indicating hearing difficulty includes at least one of parameters respectively representing a noise level at the position of a user, an angular difference between each unit and a noise source as viewed from the user, and a distance between each device and the user, besides a hearing difficulty score of each device.

FIG. 16 illustrates an example of the information indicating hearing difficulty obtained as a result of Web API processing.

In the example of FIG. 16, information indicating hearing difficulty in a case where there are two noise sources and two external units is described in a JavaScript Object Notation (JSON) format.

Data 311 to 314 represent information indicating hearing difficulty of a voice from the home agent unit.

The data 311 indicates the hearing difficulty score $S_u$ of the home agent unit, and a value thereof is 4.05.

The data 312 indicates the distance $D_{su}$ between the home agent unit and the user, and a value thereof is 5 (m).

The data 313 indicates the noise level $N_{u1}$ of a first noise source at the position of the user and the angular difference $\theta_{u1}$ between the home agent unit and the first noise source as seen from the user, and values thereof are 0.8 and 20(°), respectively.

The data 314 indicates the noise level $N_{u2}$ of a second noise source at the position of the user and the angular difference $\theta_{u2}$ between the home agent unit and the second noise source as seen from the user, and values thereof are 0.5 and 130(°), respectively.

Data 321 to 324 represent information indicating hearing difficulty of a voice from a first external unit.

The data 321 indicates the hearing difficulty score $S_{e1}$ of the first external unit, and a value thereof is 1.35.

The data 322 indicates the distance $D_{eu}$ between the first external unit and the user, and a value thereof is 3 (m).

The data 323 indicates the noise level $N_{u1}$ of the first noise source at the position of the user, and the angular difference $\theta_{e1}$ between the first external unit and the first noise source as seen from the user, and values thereof are 0.8 and 30(°), respectively.

The data 324 indicates the noise level $N_{u2}$ of the second noise source at the position of the user, and the angular difference $\theta_{e2}$ between the first external unit and the second noise source as seen from the user, and values thereof are 0.5 and 110(°), respectively.

Data 331 to 334 represent information indicating hearing difficulty of a voice from the second external unit.

The data 331 indicates the hearing difficulty score $S_{e2}$ of the second external unit, and a value thereof is 6.28.

The data 332 indicates the distance $D_{eu}$ between the second external unit and the user, and a value thereof is 8 (m).

The data 333 indicates the noise level $N_{u1}$ of the first noise source at the position of the user, and the angular difference $\theta_{e2}$ between the second external unit and the first noise source as seen from the user, and values thereof are 0.8 and 70(°), respectively.

The data 334 indicates the noise level $N_{u2}$ of the second noise source at the position of the user, and the angular difference $\theta_{e2}$ between the second external unit and the second noise source as seen from the user, and values thereof are 0.5 and 10(°), respectively.

Processing results as described above are returned to the voice output device 120, so that either the voice output device 120 or the external unit 130 is determined as the voice output unit and outputs a voice.

In the example of FIG. 16, it is considered that the first external unit having the shortest distance to the user and the smallest hearing difficulty score is determined as the voice output unit.

5. Others

In the foregoing, although the example of applying the present technology to the home agent unit used at home has been described, the technology may be applied to a unit used outdoors.

Specifically, the present technology can be applied to a unit that outputs a voice to a specific person outdoors.

For example, in a case where the present technology is applied to a digital signage, characteristics of synthetic speech can be adaptively controlled according to noise conditions around the digital signage and the position of a passerby or a person stopping and watching the digital signage.

Furthermore, in a case where the present technology is applied to a portable automatic translator, a translated synthetic speech can be output so that the other party can hear it reliably.

Moreover, in a case where the present technology is applied to an outdoor unit of an intercom, although voice synthesis is not used, high frequency emphasis and volume can be adaptively adjusted according to noise conditions around the other party and the position of the other party.

Note that at an indoor location, noise made by a crowd is loud, which is not an input voice from a specific direction. Accordingly, as a virtual noise source, there is added one for which a noise level at the position of the user is set to the minimum value of the levels of voice components in respective directions subdivided by sound source separation by the noise detection processing part 52, and the direction of the noise source is set to the same direction as that of the voice output unit main body. As a result, voice output control can be performed in consideration of the hearing difficulty due to the noise of a crowd.

Specifically, in FIG. 4, a noise source with the angular difference $\theta_u$ being 0° and the noise level $N_u$ being the minimum value of the noise levels in respective directions monitored at the position of the voice output unit is added as the noise source of noise of a crowd, thereby calculating the hearing difficulty score $S_u$ at the position of the user.

Furthermore, in an outdoor environment, there are noises from specific directions such as a siren of an emergency vehicle and advertisement and public speech on a street. It is expected that in an outdoor environment, it is difficult to detect the distance to a noise source from an image captured by a camera as compared to inside a home. Accordingly, considering that a noise source is at a distant position in outdoors compared to in homes, when the distance $D_{ns}$ from the voice output unit to the noise source is not detected, the distance $D_{ns}$ to the noise source is assumed as infinite. In this case, in FIG. 4, the hearing difficulty score $S_u$ at the position of the user is calculated as $\theta_u = 180° - \theta_s$ and $N_u = N_s$.

Note that the embodiments of the present technology are not limited to the above-described embodiments, and various modifications are possible without departing from the scope of the present technology.

Furthermore, the effects described in this specification are merely examples and are not limited, and other effects may be provided.

Moreover, the present technology can have configurations as follows.

(1)

An information processing device including a processing part that outputs, on the basis of an image and noise from a predetermined noise source which are obtained in a unit capable of outputting a voice toward a user, information indicating hearing difficulty of a voice from the unit at a position of the user.

(2)

The information processing device according to (1), in which the processing part outputs, as the information, a hearing difficulty score calculated using a noise level at the position of the user, an angular difference between the unit and the noise source as viewed from the user, and a distance between the unit and the user.

(3)

The information processing device according to (1), in which the processing part outputs, as the information, parameters that indicate a noise level at the position of the user, an angular difference between the unit and the noise source as viewed from the user, and a distance between the unit and the user, respectively.

(4)

The information processing device according to (1), in which the processing part outputs, as the information, at least one of parameters that indicate a noise level at the position of the user, an angular difference between the unit and the noise source as viewed from the user, and a distance between the unit and the user, respectively, or a hearing difficulty score calculated using the parameters.

(5)

The information processing device according to any one of (2) to (4), in which in a case where there is a plurality of the noise sources, the processing part calculates, for each of the noise sources, a noise level at the position of the user, and an angular difference between the unit and the noise source as viewed from the user.

(6)

The information processing device according to any one of (1) to (5), in which the processing part further outputs, on the basis of a position of another unit connected to the unit and capable of outputting a voice, other information indicating a hearing difficulty of a voice from the other unit at the position of the user.

(7)

The information processing device according to any one of (1) to (6), in which the information processing device is configured to output a voice to the user as the unit.

(8)

The information processing device according to (7), further including a voice output control part that generates, by using the information indicating the hearing difficulty of the voice at the position of the user, a parameter that determines a characteristic of the voice to be output toward the user, to control the outputting of the voice.

(9)

The information processing device according to (8), in which when a sound volume of the voice determined by the parameter exceeds an upper limit of a sound volume that is possible to be output, the voice output control part determines another unit connected to the unit and capable of outputting a voice as a voice output unit that outputs the voice.

(10)

The information processing device according to (9), in which the voice output control part determines the other unit as the voice output unit on the basis of a use state of the other unit by the user.

(11)

The information processing device according to (9), in which the voice output control part determines the other unit at a closer distance to the user as the voice output unit.

(12)

The information processing device according to (9), in which the voice output control part determines the other unit having a larger angular difference with the noise source as viewed from the user as the voice output unit.

(13)

An information processing method including a step of outputting, on the basis of an image and noise from a predetermined noise source which are obtained in a unit capable of outputting a voice toward a user, information indicating hearing difficulty of a voice from the unit at a position of the user.

(14)

A voice output device including a voice output control part that generates, by using information that is generated on the basis of an image and noise from a predetermined noise source which are obtained in an own device and indicates hearing difficulty of a voice from the own device at a position of a user, a parameter that determines a characteristic of the voice to be output toward the user, to control outputting of the voice.

(15)

The voice output device according to (14), in which the information includes a hearing difficulty score calculated using a noise level at the position of the user, an angular difference between the own device and the noise source as viewed from the user, and a distance between the own device and the user.

(16)

The voice output device according to (14), in which the information includes parameters that indicate a noise level at the position of the user, an angular difference between the own device and the noise source as viewed from the user, and a distance between the own device and the user, respectively.

(17)

The voice output device according to (14), in which the information includes at least one of parameters that indicate a noise level at the position of the user, an angular difference between the own device and the noise source as viewed from the user, and a distance between the own device and the user, respectively, or a hearing difficulty score calculated using the parameters.

(18)

A voice output method including a step of generating, by using information that is generated on the basis of an image and noise from a predetermined noise source which are obtained in an own device and indicates hearing difficulty of a voice from the own device at a position of a user, a parameter that determines a characteristic of the voice to be output toward the user, to control outputting of the voice.

REFERENCE SIGNS LIST

20 Voice output device
51 Voice input device
52 Noise detection processing part
53 Sensor device
54 Image recognition engine
55 Hearing difficulty estimation part
56 Voice output control part
57 Notification speech text
58 Voice synthesis engine
59 Output voice signal processing part
60 Voice reproduction device
120 Voice output device
130 External unit
200 Cloud
210 Network
220 Server

The invention claimed is:

1. An information processing device, comprising:
circuitry configured to:
receive first information associated with an image and a noise, wherein
the noise is from a noise source,
the first information is received from a first voice output device that outputs a first voice toward a user, and
the information processing device is associated with the user;
calculate an angular difference between the first voice output device and the noise source with respect to a position of the user,
wherein the angular difference is calculated based on the received first information;

calculate a hearing difficulty score based on the calculated angular difference between the first voice output device and the noise source; and output second information based on the calculated hearing difficulty score,
wherein the second information indicates a hearing difficulty of the first voice at the position of the user.

2. The information processing device according to claim 1, wherein the circuitry is further configured to calculate the hearing difficulty score based on a noise level at the position of the user and a distance between the first voice output device and the user.

3. The information processing device according to claim 1, wherein the circuitry is further configured to output, as the second information, a plurality of parameters that indicates a noise level at the position of the user, the angular difference between the first voice output device and the noise source with respect to the position of the user, and a distance between the first voice output device and the user.

4. The information processing device according to claim 1, wherein the circuitry is further configured to:
calculate the hearing difficulty score based on a plurality of parameters; and
output, as the second information, at least one of the hearing difficulty score or the plurality of parameters,
wherein the plurality of parameters indicates a noise level at the position of the user, the angular difference between the first voice output device and the noise source, and a distance between the first voice output device and the user.

5. The information processing device according to claim 2, wherein
the circuitry is further configured to calculate, for each noise source of a plurality of noise sources, the noise level at the position of the user and an angular difference between the first voice output device and the each noise source, and
the plurality of noise sources includes the noise source.

6. The information processing device according to claim 1, wherein
the circuitry is further configured to output third information based on a position of a specific device connected to the first voice output device,
the specific device outputs a second voice, and
the third information indicates a hearing difficulty of the second voice at the position of the user.

7. The information processing device according to claim 1, wherein the information processing device is configured to output the first voice to the user.

8. The information processing device according to claim 7, wherein the circuitry is further configured to:
generate, based on the second information indicating the hearing difficulty of the first voice at the position of the user, a parameter associated with a characteristic of the first voice; and
control an output of the first voice based on the generated parameter.

9. The information processing device according to claim 8, wherein
the circuitry is further configured to determine a specific device based on a first sound volume of the first voice that exceeds an upper limit of a second sound volume,
the specific device is connected to the first voice output device,
the second sound volume is a maximum sound volume output by the first voice output device, and
the specific device is a second voice output device that outputs a second voice.

10. The information processing device according to claim 9, wherein the circuitry is further configured to determine the specific device as the second voice output device based on a use state of the specific device by the user.

11. The information processing device according to claim 9, wherein the circuitry is further configured to determine the specific device as the second voice output device based on distance between the user and the specific device.

12. The information processing device according to claim 9, wherein
the circuitry is further configured to determine the specific device as the second voice output device based on an angular difference between the specific device and the noise source, and
the angular difference between the specific device and the noise source is with respect to the position of the user.

13. An information processing method, comprising:
receiving first information associated with an image and a noise, wherein
the noise is from a noise source, and
the first information is received from a voice output device that outputs a voice toward a user;
calculating an angular difference between the voice output device and the noise source with respect to a position of the user,
wherein the angular difference is calculated based on the received first information;
calculating a hearing difficulty score based on the calculated angular difference between the voice output device and the noise source; and
outputting second information based on the calculated hearing difficulty score,
wherein the second information indicates a hearing difficulty of the voice at the position of the user.

14. A voice output device, comprising:
circuitry configured to:
receive first information associated with an image and a noise, wherein
the noise is from a noise source;
calculate an angular difference between the voice output device and the noise source with respect to a position of a user, wherein
the angular difference is calculated based on the received first information, and
the voice output device is associated with the user;
calculate a hearing difficulty score based on the calculated angular difference between the voice output device and the noise source,
wherein the calculated hearing difficulty score indicates hearing difficulty of a voice from the voice output device, at the position of the user;
generate, based on the hearing difficulty score, a specific parameter associated with a characteristic of the voice; and
control output of the voice toward the user based on the generated specific parameter.

15. The voice output device according to claim 14, wherein the circuitry is further configured to calculate the hearing difficulty score based on a noise level at the position of the user and a distance between the voice output device and the user.

16. The voice output device according to claim 14, wherein
the circuitry is further configured to generate second information based on the received first information, the second information includes a plurality of parameters that indicates a noise level at the position of the user, the angular difference between the voice output device and the noise source, and a distance between the voice output device and the user, and the plurality of parameters is different from the specific parameter.

17. The voice output device according to claim 14, wherein the circuitry is further configured to:

calculate the hearing difficulty score based on a plurality of parameters; and generate second information based on the received first information and the calculated hearing difficulty score, wherein the second information includes at least one of the plurality of parameters or the hearing difficulty score, the plurality of parameters indicates a noise level at the position of the user, the angular difference between the voice output device and the noise source, and a distance between the voice output device and the user, and the plurality of parameters is different from the specific parameter.

18. A voice output method, comprising:

receiving first information associated with an image and a noise, wherein the noise is from a noise source;

calculating an angular difference between a voice output device and the noise source with respect to a position of a user, wherein the angular difference is calculated based on the received first information, and the voice output device is associated with the user;

calculating a hearing difficulty score based on the calculated angular difference between the voice output device and the noise source, wherein the calculated hearing difficulty score indicates hearing difficulty of a voice from the voice output device, at the position of the user;

generating, based on the hearing difficulty score, a specific parameter associated with a characteristic of the voice; and controlling output of the voice toward the user based on the generated specific parameter.

19. An information processing device, comprising:

circuitry configured to:

receive first information associated with an image and a noise from a voice output device, wherein the noise is from a noise source, and the voice output device outputs a voice; and output second information based on the received first information, wherein the second information indicates a hearing difficulty of the voice at a position of a user, the information processing device is associated with the user, the second information includes a plurality of parameters, and the plurality of parameters indicates a noise level at the position of the user, an angular difference between the voice output device and the noise source as viewed from the user, and a distance between the voice output device and the user.

20. An information processing device, comprising:

circuitry configured to:

receive first information associated with an image and a noise from a voice output device, wherein the noise is from a noise source, and the voice output device outputs a first voice;

output second information based on the received first information, wherein the second information indicates a hearing difficulty of the first voice at a position of a user, and the information processing device is associated with the user; and output third information based on a position of a specific device, wherein the specific device is connected to the voice output device, the specific device outputs a second voice, and the third information indicates a hearing difficulty of the second voice, from the specific device, at the position of the user.

* * * * *